United States Patent
Kikuchi et al.

(10) Patent No.: US 9,853,014 B2
(45) Date of Patent: Dec. 26, 2017

(54) ELECTRONIC COMPONENT, ELECTRONIC APPARATUS, AND METHOD OF MANUFACTURING ELECTRONIC APPARATUS

(71) Applicant: FUJITSU LIMITED, Kawasaki-shi, Kanagawa (JP)

(72) Inventors: Ryo Kikuchi, Sagamihara (JP); Nobuhiro Imaizumi, Atsugi (JP); Hiroshi Onuki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/275,752

(22) Filed: Sep. 26, 2016

(65) Prior Publication Data

US 2017/0098631 A1     Apr. 6, 2017

(30) Foreign Application Priority Data

Oct. 1, 2015   (JP) ................. 2015-195748

(51) Int. Cl.
*H01L 23/52* (2006.01)
*H01L 25/065* (2006.01)
(Continued)

(52) U.S. Cl.
CPC .......... *H01L 25/0657* (2013.01); *H01L 24/02* (2013.01); *H01L 24/11* (2013.01); *H01L 24/13* (2013.01); *H01L 25/50* (2013.01); *H01L 2224/0225* (2013.01); *H01L 2224/0239* (2013.01); *H01L 2224/02372* (2013.01); *H01L 2224/02373* (2013.01);
(Continued)

(58) Field of Classification Search
CPC ..... H01L 25/0657; H01L 24/02; H01L 24/11; H01L 24/13; H01L 25/50
USPC ........................................................ 257/737
See application file for complete search history.

(56) References Cited

U.S. PATENT DOCUMENTS 7,279,771 B2 * 10/2007 Sunohara .......... H01L 23/49822
174/255
7,507,913 B2 * 3/2009 Inagaki ............. H01L 23/49816
174/260

(Continued)

FOREIGN PATENT DOCUMENTS

| JP | 2011-503862 A1 | 1/2011 |
| JP | 2011-23719 A1 | 2/2011 |
| JP | 2013-168503 A1 | 8/2013 |
| JP | 2013-187423 A1 | 9/2013 |

OTHER PUBLICATIONS

Office Action of Taiwanese Patent Application No. 105131844 dated Sep. 22, 2017 (3 Sheets, 3 Sheets translation, 6 Sheets total).

*Primary Examiner* — Luan C Thai
(74) *Attorney, Agent, or Firm* — Kratz, Quintos & Hanson, LLP

(57) ABSTRACT

An electronic component includes a substrate configured to include a first portion that first thermal conductivity, and have a first surface and a second surface opposite to the first surface; a second portion configured to be formed inside the first portion, and have second thermal conductivity lower than the first thermal conductivity; a first terminal configured to be formed to correspond to the second portion on a side of the first surface; and a second terminal configured to be formed on a side of the second surface.

19 Claims, 26 Drawing Sheets

(51) Int. Cl.
*H01L 25/00* (2006.01)
*H01L 23/00* (2006.01)

(52) U.S. Cl.
CPC ............ *H01L 2224/11462* (2013.01); *H01L 2224/13024* (2013.01); *H01L 2224/1357* (2013.01); *H01L 2224/13147* (2013.01); *H01L 2224/13564* (2013.01); *H01L 2224/13611* (2013.01); *H01L 2224/13639* (2013.01); *H01L 2225/06513* (2013.01); *H01L 2225/06544* (2013.01); *H01L 2225/06555* (2013.01); *H01L 2225/06589* (2013.01); *H01L 2924/014* (2013.01); *H01L 2924/01013* (2013.01); *H01L 2924/01029* (2013.01); *H01L 2924/3512* (2013.01)

(56) References Cited

U.S. PATENT DOCUMENTS

| | | | | |
|---|---|---|---|---|
| 7,564,118 | B2 * | 7/2009 | Pogge | H01L 21/6835 |
| | | | | 257/621 |
| 8,928,145 | B2 * | 1/2015 | Andry | H01L 23/556 |
| | | | | 257/502 |
| 9,119,319 | B2 * | 8/2015 | Kaneda | H05K 1/18 |
| 9,153,559 | B2 * | 10/2015 | Lee | H01L 25/0657 |
| 2009/0127667 | A1 * | 5/2009 | Iwata | H01L 21/76898 |
| | | | | 257/621 |
| 2010/0244246 | A1 | 9/2010 | Caplet | |
| 2011/0006422 | A1 | 1/2011 | Daubenspeck | |
| 2013/0234323 | A1 | 9/2013 | Miyazaki | |
| 2015/0243618 | A1 | 8/2015 | Ayotte | |

\* cited by examiner

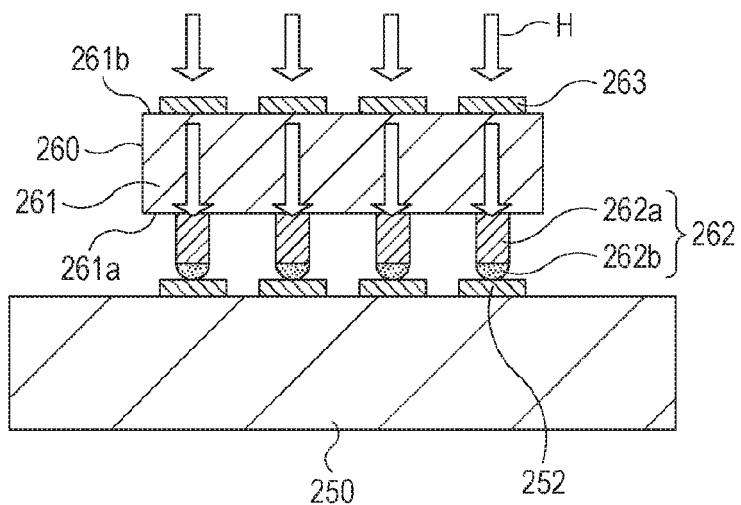
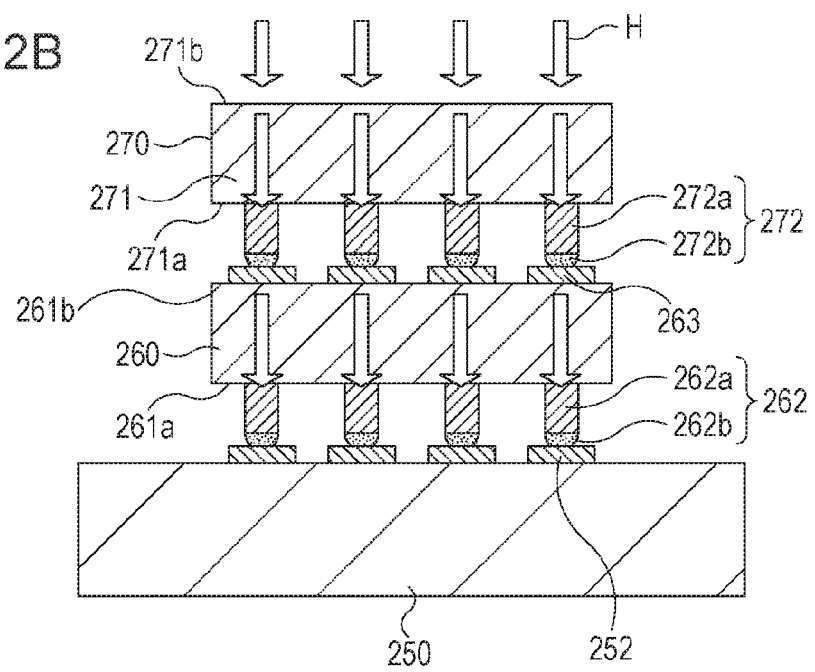

ELECTRONIC COMPONENT, ELECTRONIC APPARATUS, AND METHOD OF MANUFACTURING ELECTRONIC APPARATUS

CROSS-REFERENCE TO RELATED APPLICATION

This application is based upon and claims the benefit of priority of the prior Japanese Patent Application No. 2015-195748, filed on Oct. 1, 2015, the entire contents of which are incorporated herein by reference.

FIELD

The embodiments discussed herein are related to an electronic component, an electronic apparatus, and a method of manufacturing the electronic apparatus.

BACKGROUND

There are known technologies for stacking semiconductor elements by solder bonding on circuit substrates and technologies for stacking plural semiconductor elements in which through silicon vias (TSV) are formed by solder bonding. The solder bonding is executed, for example, by heating to melt solders used for terminals of semiconductor elements.

Japanese Laid-open Patent Publication No. 2013-168503 and Japanese Laid-open Patent Publication No. 2013-187423 are examples of the related art.

SUMMARY

According to an aspect of the invention, an electronic component includes a substrate configured to include a first portion that first thermal conductivity, and have a first surface and a second surface opposite to the first surface; a second portion configured to be formed inside the first portion, and have second thermal conductivity lower than the first thermal conductivity; a first terminal configured to be formed to correspond to the second portion on a side of the first surface; and a second terminal configured to be formed on a side of the second surface.

According to another aspect of the invention, a method of manufacturing an electronic apparatus includes facing a second terminal of a first electronic component to a third terminal of a second electronic component, the first electronic component configured to include a first substrate which includes a first portion which has first thermal conductivity, a second portion which is formed inside the first portion and has second thermal conductivity lower than the first thermal conductivity, a first terminal which is formed to correspond to the second portion on a side of a first surface of the first substrate, and the second terminal which is formed on a side of a second surface of the first substrate opposite to the first surface; and coupling the third terminal and the second terminal by executing heating from a side of the second electronic component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B are diagrams illustrating an example of a semiconductor chip stacking process;

DESCRIPTION OF EMBODIMENTS

In stacking of plural semiconductor elements in the related art, when a terminal of another semiconductor element (a second semiconductor element) is bonded to a terminal formed on the rear surface side of a certain semiconductor element (a first semiconductor element), a terminal formed on the front surfaces of the first semiconductor element deteriorate due to heating of the bonding in some cases. There is a possibility of the deterioration in the terminals causing bonding defects with semiconductor element (a third semiconductor element) or a circuit substrate bonded on the front surface of the first semiconductor element.

Such bonding defect is not limited to the semiconductor element, but may also occur when various electronic components are stacked. There is a concern of the bonding defects between electronic components degrading capabilities and qualities of electronic apparatuses including the electronic components.

Figure 1:
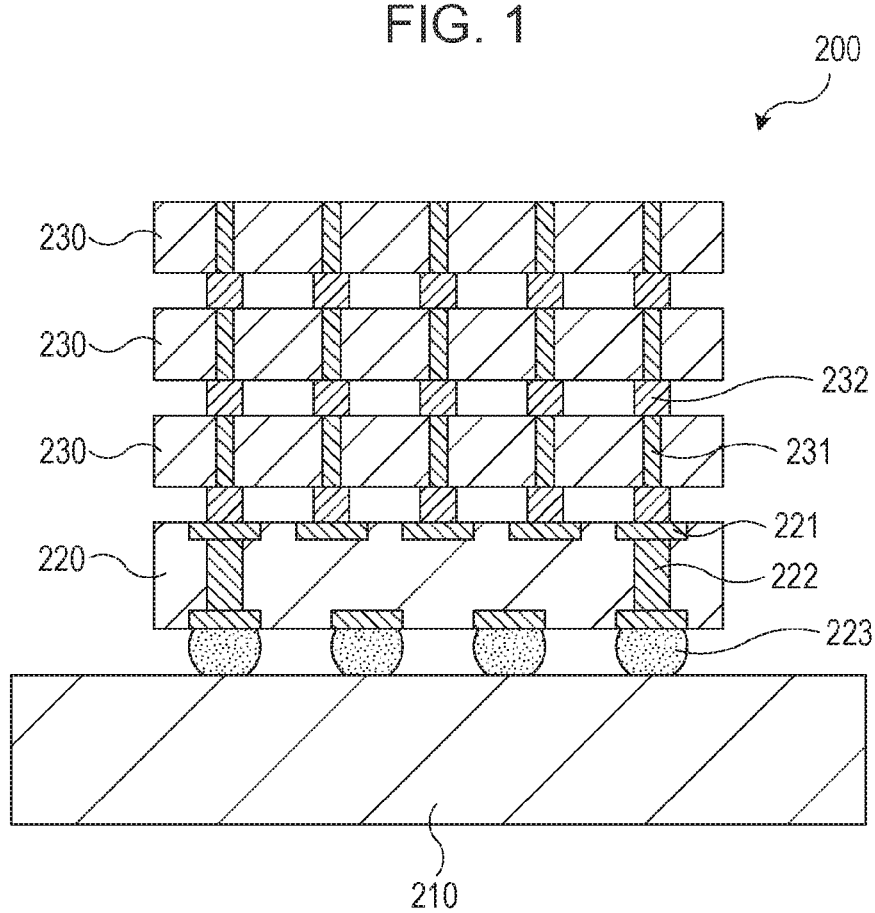
FIG. 1 is a diagram illustrating an example of a stack structure of electronic components.

First, an example of a technology for stacking electronic components will be described. FIG. 1 is a diagram illustrating an example of a stack structure of electronic components. FIG. 1 schematically illustrates cross-sectional surfaces of main portions in the example of the stack configuration.

A stack structure 200 illustrated in FIG. 1 includes a package substrate 210 as a circuit substrate, an interposer 220 as a relay substrate or a circuit substrate, and a plurality (herein, for example, 3) of stacked semiconductor chips 230 as semiconductor elements.

The semiconductor chips 230 include conductor portions 231 that are conductive between front and rear surfaces. In the conductor portions 231, for example, a TSV technology is used. The semiconductor chips 230 on the upper side are bonded to the conductor portions 231 of the semiconductor chips 230 on the lower side by terminals 232 in which solder is used. Thus, the upper and lower semiconductor chips 230 are electrically coupled to each other.

The interposer 220 includes conductor portions 221 on front and rear surfaces and conductor portions 222 such as vias that are conductive between the conductor portions 221 on the front and rear surfaces. For example, a so-called Si interposer 220 in which the conductor portions 221 and 222 are formed in a silicon (Si) substrate is used as the interposer 220. Additionally, a so-called organic interposer in which the conductor portions 221 and 222 are formed in an organic substrate or a so-called glass interposer in which the conductor portions 221 and 222 are formed in a glass substrate may be used as the interposer 220.

A group of the above-described semiconductor chips 230 is stacked on the interposer 220. The lowermost semiconductor chip 230 in the group of the semiconductor chips 230 which are stacked or are to be stacked is bonded to the conductor portions 221 on the front surface of the interposer 220 by the terminals 232. Thus, the lowermost semiconductor chip 230 to be stacked or the group of the stacked semiconductor chips 230 is electrically coupled to the interposer 220.

The package substrate 210 includes conductor portions, which is not illustrated herein, on the surface of the side or inside the side on which the interposer 220 and the group of the semiconductor chips 230 are stacked. The interposer 220 is bonded to the conductor portions on the front surface of the package substrate 210 by terminals 223 in which solder balls or the like are used. Thus, the interposer 220 on which the group of the semiconductor chips 230 is stacked or is to be stacked is electrically coupled to the package substrate 210.

By stacking the group of the semiconductor chips 230 using the relatively minute terminals 232 as in the stack structure 200, it is possible to achieve an improvement in a packaging density on the package substrate 210, an improvement in a transmission capability realized by shortening the lengths of wirings, and a large number of terminals realized by improving a terminal density and high functionality realized by the large number of terminals.

In the stacking of the semiconductor chips, a flip chip packaging technology is used. FIGS. 2A and 2B are diagrams illustrating an example of a semiconductor chip stacking process. FIGS. 2A and 2B schematically illustrate cross-sectional surfaces of main portions in the example of the stacking process.

As illustrated in FIG. 2A, a lowermost semiconductor chip 260 is stacked on a predetermined substrate 250 such as a semiconductor chip or a circuit substrate. The substrate 250 includes terminals 252 (electrodes) at positions corresponding to terminals 262 of semiconductor chips 260 to be stacked.

The semiconductor chip 260 includes, for example, terminals 262 that include pillar electrodes 262a and solders 262b formed on the front ends of the pillar electrodes 262a on the side of one surface (front surface) 261a of a body portion 261. The terminals 262 are electrically coupled to circuit elements inside the body portion 261. The semiconductor chip 260 includes terminals 263 (electrodes) that are formed at positions corresponding to terminals 272 of a semiconductor chip 270 to be stacked, as will be described below, on the side of the other surface (rear surface) 261b of the body portion 261. The terminals 263 are electrically coupled to the circuit elements inside the body portion 261 and the terminals 262 on the side of the front surface 261a using TSVs or the like.

The side of the terminals 262 of the semiconductor chip 260 faces the side of the terminals 252 of the substrate 250. The terminals 262 are bonded to the terminals 252 by executing, for example, heating at a temperature at which the solders 262b are melted and pressurization so that a predetermined load is applied to the terminals 262 from the side of the semiconductor chip 260. In FIG. 2A, the heating (heat H) at the time of the bonding is schematically indicated by thick arrows for convenience.

After the semiconductor chip 260 is bonded, as illustrated in FIG. 2B, the semiconductor chip 270 is further stacked on the semiconductor chip 260. The semiconductor chip 270 includes, on the side of one surface (front surface) 271a of a body portion 271, terminals 272 that include pillar electrodes 272a and solders 272b formed on the front ends of the pillar electrodes 272a. The terminals 272 are electrically coupled to circuit elements inside the body portion 271. The terminals 272 of the semiconductor chip 270 are formed at positions corresponding to the terminals 263 of the semiconductor chip 260.

The side of the terminals 272 of the semiconductor chip 270 faces the side of the terminals 263 of the semiconductor chip 260. The terminals 272 are bonded to the terminals 263 by executing, for example, heating at a temperature at which the solders 272b are melted and pressurization so that a predetermined load is applied to the terminals 272 from the side of the semiconductor chip 270. In FIG. 2B, the heating (heat H) at the time of the bonding is schematically indicated by thick arrows for convenience.

In a case in which another semiconductor chip is further stacked on the semiconductor chip 270, the other semiconductor chip is stacked in the similar way to the semiconductor chip 270. Here, the semiconductor chip 260 is first stacked on the substrate 250 and the semiconductor chip 270 is subsequently stacked on the semiconductor chip 260. However, after the semiconductor chip 270 or the like is stacked on the semiconductor chip 260, the stack body may also be stacked on the substrate 250.

Incidentally, when the semiconductor chip 270 is stacked on the semiconductor chip 260, for example, the terminals 272 on the side of the front surface 271a of the semiconductor chip 270 are bonded to the terminals 263 on the side of the rear surface 261b of the semiconductor chip 260 by executing, for example, heating from the side of the semiconductor chip 270, as in FIG. 2B. The heat H applied from the side of the semiconductor chip 270 at the time of the bonding may also be transferred to the semiconductor chip 260 in the lower layer.

When the heat H is transferred from the semiconductor chip 270 to the semiconductor chip 260 in this way and the heat H is transferred to the terminals 262 formed on the side of the front surface 261a of the semiconductor chip 260, as schematically indicated by thick arrows in FIG. 2B, the terminals 262 are degraded in some cases. For example, component diffusion between the solders 262b and the pillar electrodes 262a of the terminals 262 or component diffusion between the solders 262b and the terminals 252 of the substrate 250 below the solders 262b progress alloying of the solders 262b. There is a concern of the alloying of the solders 262b causing weakness of the bonding between the terminals 262 and 252 and accordingly causing bonding defects such as crack or disconnection, thereby deteriorating connection reliability between the semiconductor chip 260 and the substrate 250.

In FIGS. 2A and 2B, the example has been described in which the semiconductor chip 270 is stacked on the semiconductor chip 260 in the state in which the terminals 262 of the semiconductor chip 260 are bonded to the terminals 252 of the substrate 250. Additionally, even when heat H is transferred, to the terminals 262 of the semiconductor chip 260, from the side of the semiconductor chip 270 to be stacked in a state in which the terminals 262 are not bonded to the terminals 252 of the substrate 250, component diffusion between the solders 262b and the pillar electrodes 262a may progress the alloying of the solders 262b. When the alloying progresses in this way, the semiconductor chip 260 on which the semiconductor chip 270 is stacked is stacked on the substrate 250, there is a concern of bonding defects occurring, such as non-bonding of the terminals 262 (the solders 262b) and the terminals 252 and weak strength, fragility, or the like even at the time of the bonding.

The alloying of the solders 262b is not limited to the time of stacking of the semiconductor chip 270, but may also progress even due to transfer of heat applied when another semiconductor chip is further stacked thereon. There is a higher possibility of the solders 262b being alloyed or fragile occurring as the number of stacks increases and heat is repeatedly applied. Thus, there is a high possibility of the above-described bonding defects occurring. Herein, the stacking of the group of the semiconductor chips has been exemplified. However, the above-described bonding defects are not limited to the stacking of the group of the semiconductor chips, but may also occur even when various electronic component groups are stacked.

In view of the above-described circumstance, bonding defects between stacked electronic components may be suppressed by adopting a technique to be described in the following embodiments.

Figure 3:
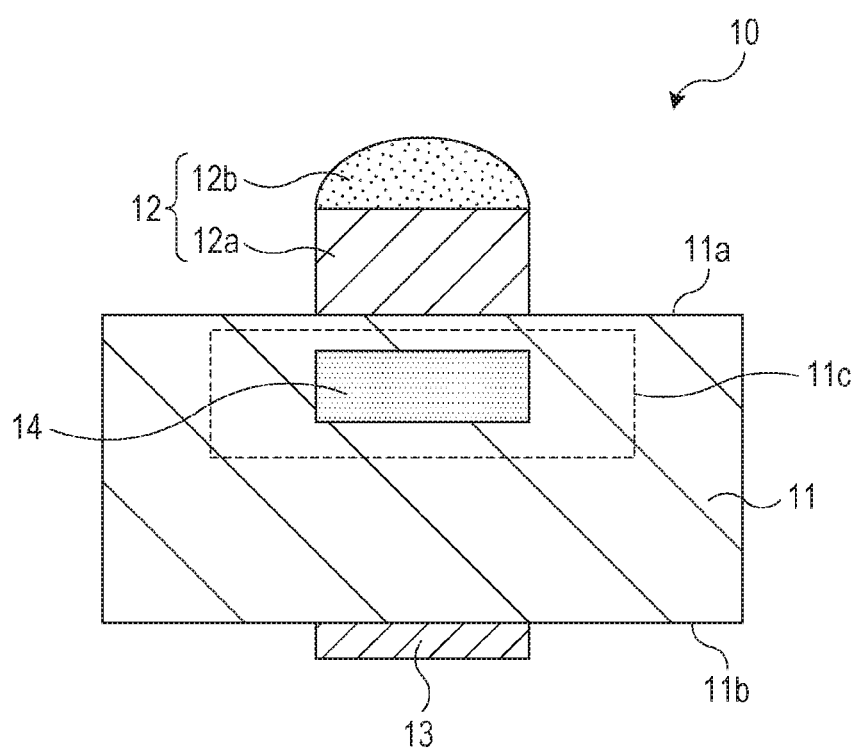
FIG. 3 is a diagram illustrating an example of an electronic component according to a first embodiment.

First, a first embodiment will be described. FIG. 3 is a diagram illustrating an example of an electronic component according to a first embodiment. FIG. 3 schematically illustrates cross-sectional surfaces of main portions in the example of the electronic component according to the first embodiment.

An electronic component 10 illustrated in FIG. 3 includes a substrate 11, a terminal 12 formed on one surface (front surface) 11a of the substrate 11, and a terminal 13 formed on the other surface (rear surface) 11b of the substrate 11. The electronic component 10 is, for example, a semiconductor chip, a semiconductor package (semiconductor device) including a semiconductor chip, or a circuit substrate. The electronic component 10 may be a separated component or may be a component before separation. The substrate 11 is a body portion of the electronic component 10 such as a semiconductor chip, a semiconductor package, or a circuit substrate.

The substrate 11 includes a portion 11c that has predetermined thermal conductivity. The portion 11c is, for example, a layer containing an insulation portion and a conductor portion such as a wiring formed in the insulation portion, a via, or an electrode, or an insulation portion of such a layer. In FIG. 3 (and FIGS. 4A to 5B to be described below), the portion 11c is schematically indicated in a dotted range for convenience, but the position or shape of the portion 11c is not limited to the illustrated example.

Inside the portion 11c of the substrate 11, a portion 14 that has thermal conductivity lower than the thermal conductivity of the portion 11c is formed. The portion 14 that has the relatively low thermal conductivity is, for example, a hollow portion formed inside the portion 11c that is solid and has relatively high thermal conductivity. A material such as a resin or ceramics which has relatively low thermal conductivity or a material such as a resin or ceramics that has relatively low thermal conductivity and has a gap (a bubble, a fine hole, or the like) therein may be used for the material of the portion 14.

The terminal 12 is formed at a position corresponding to the portion 14 that has the relatively low thermal conductivity on the side of the front surface 11a of the substrate 11. Herein, the terminal 12 including a pillar electrode 12a that protrudes from the front surface 11a and a solder 12b that is formed at the front end (upper end) of the pillar electrode 12a is illustrated as an example. For example, the terminal 13 such as an electrode is formed on the side of the rear surface 11b of the substrate 11. The electrode is a pad or a land as a part of a wiring. The portion 14 may be configured such that heat transfer from the side of the terminal 13 to the side of the terminal 12 is suppressed, compared to a case in which the portion 14 is not formed inside the portion 11c.

In the electronic component 10 having the above-described configuration, alloying of the terminal 12 (the solder 12b) and bonding defects caused due to the alloying are suppressed when another electronic component is stacked on the side of the terminal 13. This point will be described with reference to the following FIGS. 4A and 4B.

Figure 4A:
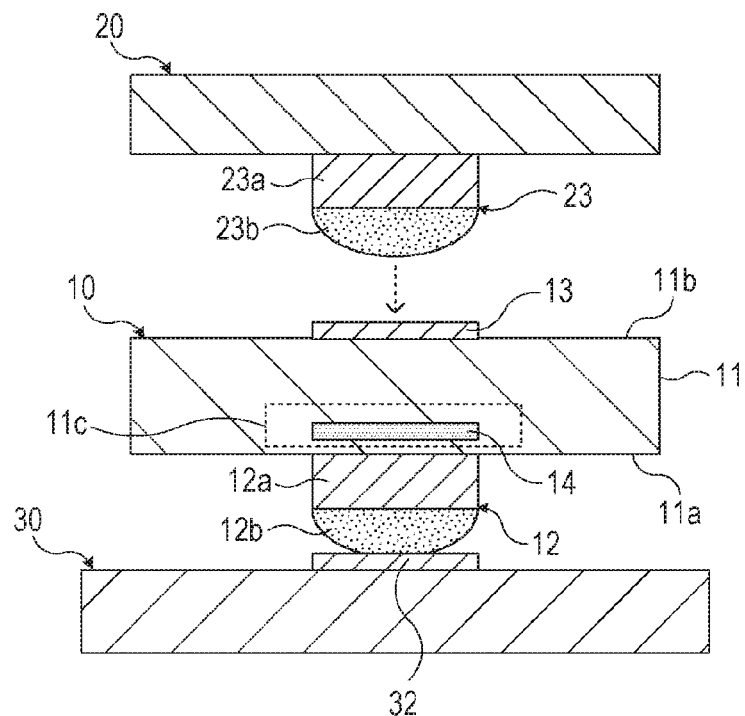
FIGS. 4A and 4B are diagrams illustrating an example of an electronic component stacking process according to the first embodiment.
Figure 4B:
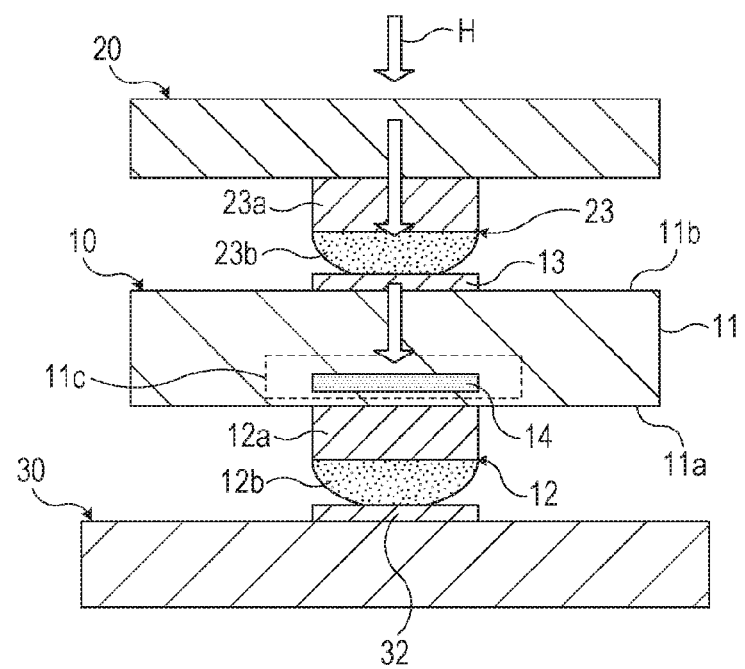

FIGS. 4A and 4B are diagrams illustrating an example of an electronic component stacking process according to the first embodiment. FIGS. 4A and 4B schematically illustrate cross-sectional surfaces of main portions in the example of the electronic component stacking process according to the first embodiment.

For example, as illustrated in FIG. 4A, the electronic component 10 is stacked along with another electronic component 30. The terminal 12 (the solder 12b) and a terminal 32 are bonded to each other, and thus electronic components 10 and 30 are electrically coupled. Still another electronic component 20 is stacked on the side of the terminal 13 opposite to the side of the terminal 12b of the electronic component 10 stacked on the electronic component 30 in this way. As the electronic components 30 and 20, for example, semiconductor chips, semiconductor packages, or circuit substrates (printed substrates, interposers, or the like) may be used. The electronic components 30 and 20 may be separated components or may be components before separation.

When the other electronic component 20 is stacked on the side of the terminal 13 of the electronic component 10, the terminal 13 of the electronic component 10 is first faced to a terminal 23 of the electronic component 20 to be stacked. The terminal 23 of the electronic component 20 includes, for example, a pillar electrode 23a and a solder 23b that is formed at the end point of the pillar electrode 23a. As illustrated in FIGS. 4A and 4B, the terminal 13 of the electronic component 10 is faced to the terminal 23 of the electronic component 20. As illustrated in FIG. 4B, the terminal 13 is bonded to the terminal 23 by executing heating from the side of the electronic component 20. In FIG. 4B, heating (heat H) at the time of the bonding is schematically indicated by thick arrows for convenience.

As illustrated in FIG. 4B, the heat H given from the side of the electronic component 20 at the time of the bonding may be transferred from portions of the terminals 23 and 13 further to the side of the terminal 12 through the inside of the substrate 11 of the electronic component 10. Even in a case in which the heat transfer occurs, the heat transfer to the terminal 12 is suppressed because the portion 14 that has the relatively low thermal conductivity is formed along a heat transfer path to the terminal 12 in the electronic component 10. Since the heat transfer to the terminal 12 is suppressed by the portion 14, the alloying of the terminal 12, that is, the alloying of the solder 12b caused due to component diffusion to the pillar electrode 12a or the terminal 32, and the fragility caused by the alloying are suppressed, and thus a bonding defect between the terminals 12 and 32 is suppressed.

Even in a case in which an electronic component is further stacked on the electronic component 20, the alloying of the solder 12b and a bonding defect between the terminals 12 and 32 caused by the alloying are similarly suppressed against the heat given from the side of the electronic component.

Figure 5A:
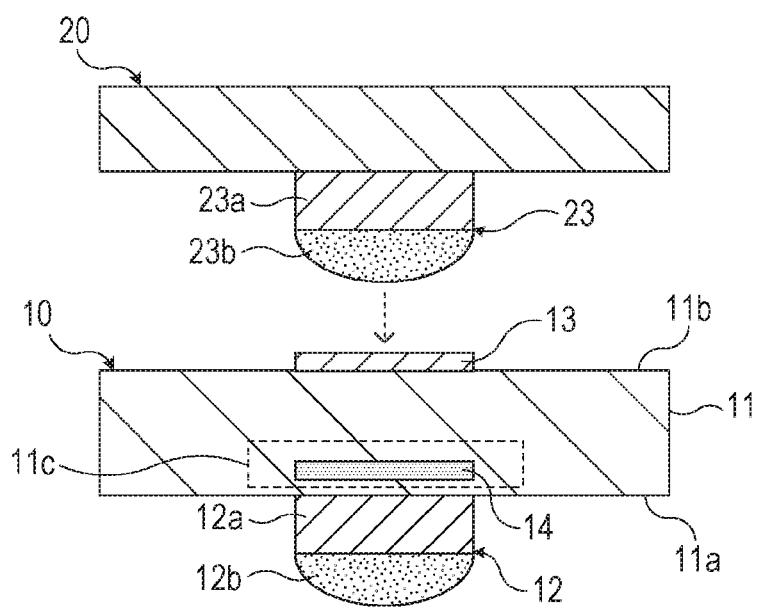
FIGS. 5A and 5B are diagrams illustrating another example of the electronic component stacking process according to the first embodiment.
Figure 5B:
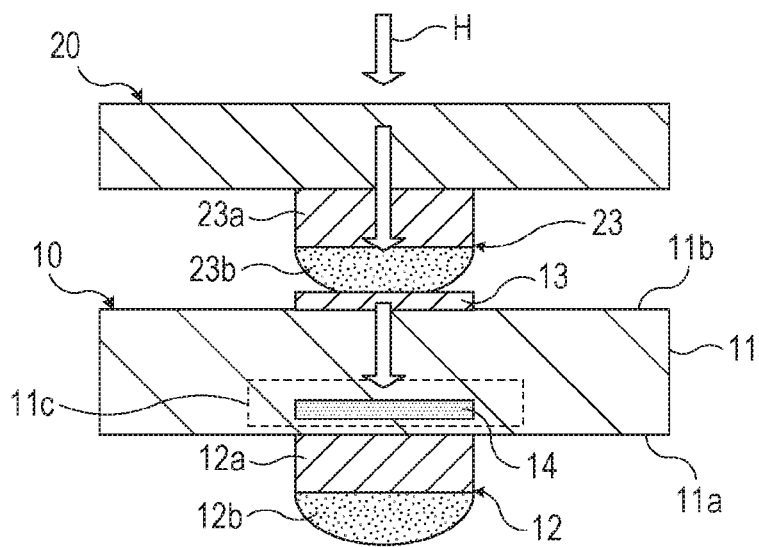

FIGS. 5A and 5B are diagrams illustrating another example of the electronic component stacking process according to the first embodiment. FIGS. 5A and 5B schematically illustrate cross-sectional surfaces of main portions in the other example of the electronic component stacking process according to the first embodiment.

FIGS. 5A and 5B illustrate an example of a case in which the electronic component 10 is not stacked on the electronic component 30, as exemplified with reference to FIGS. 4A and 4B. The terminal 23 of the electronic component 20 is faced to the terminal 13 of the electronic component 10, as illustrated in FIGS. 5A and 5B, in a state in which the electronic component 10 is not stacked on the electronic component 30 in this way. As illustrated in FIG. 5B, the terminal 13 and the terminal 23 are bonded by executing heating from the side of the electronic component 20. In FIG. 5B, heating (heat H) at the time of the bonding is schematically indicated by thick arrows for convenience.

As illustrated in FIG. 5B, the heat H given from the side of the electronic component 20 at the time of the bonding may be transferred to the side of the terminal 12 through the inside of the substrate 11 of the electronic component 10. Even in a case in which the heat transfer occurs, the portion 14 having the relatively low thermal conductivity is formed in the electronic component 10, and thus the heat transfer to the terminal 12 is suppressed, thereby suppressing the alloying of the terminal 12, that is, the alloying of the solder 12b caused due to component diffusion with the pillar electrode 12a. Even in a case in which the electronic component 10 on which the electronic component 20 is stacked is stacked on the electronic component 30 (see FIGS. 4A and 4B), the alloying of the solder 12b is suppressed, thereby suppressing a bonding defect between the terminals 12 and 32 at the time of the bonding with the electronic component 30 using the terminal 12 including the solder 12b is suppressed.

In this way, in the electronic component 10, it is possible to suppressing the alloying of the solder 12b of the terminal 12 and the bonding defect caused due to the alloying when the another electronic component 20 is stacked on the side of the terminal 13. Thus, it is possible to realize an electronic apparatus with a high capability and high quality in which the bonding defect is suppressed.

Next, a second embodiment will be described. Herein, an example in which a semiconductor chip is used in an electronic component will be described as the second embodiment.

Figure 6:
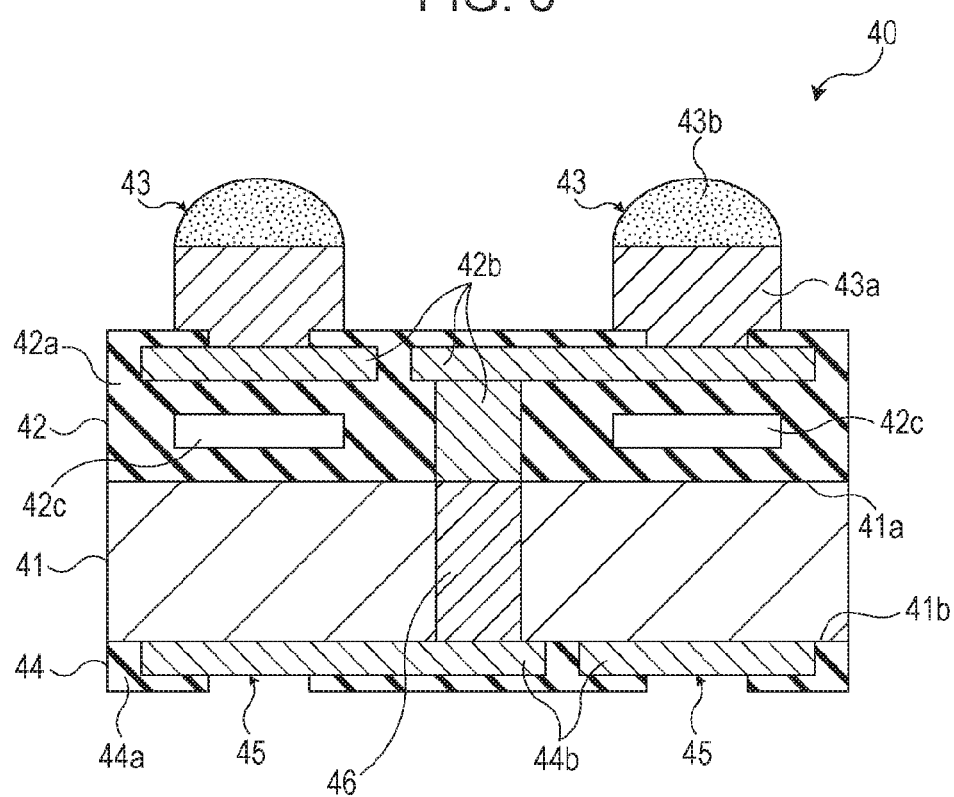
FIG. 6 is a diagram illustrating an example of a semiconductor chip according to a second embodiment.

FIG. 6 is a diagram illustrating an example of a semiconductor chip according to the second embodiment. FIG. 6 schematically illustrates cross-sectional surfaces of main portions in the example of the semiconductor chip according to the second embodiment.

A semiconductor chip 40 illustrated in FIG. 6 includes a semiconductor substrate 41, a wiring layer 42, terminals 43, a writing layer 44, and terminals 45. The semiconductor substrate 41 is a semiconductor substrate such as silicon (Si). Circuit elements such as transistors, resistors, capacitors (none of which is illustrated) are formed on a side of one surface as a front surface 41a (circuit surface) of the semiconductor substrate 41.

The wiring layer 42 is formed on the side of the front surface 41a of the semiconductor substrate 41. The wiring layer 42 includes insulation portion 42a and a conductor portions 42b formed inside the insulation portion 42a. In the insulation portion 42a, any of various organic-based or inorganic-based insulation materials is used. The conductor portion 42b may include a conductor pattern such as a wiring, a via, or a pad. In the conductor portion 42b, any of various conductive materials such as Cu or Al is used.

The terminals 43 are formed on parts (pads) of the conductor portions 42b of the wiring layer 42 exposed from the insulation portion 42a. In FIG. 6, two terminals 43 are illustrated as examples. The terminal 43 includes a pillar electrode 43a and a solder 43b formed on the front end (upper end) of the pillar electrode 43a.

The wiring layer 44 is formed on the side of the other surface as a rear surface 41b of the semiconductor substrate 41. The wiring layer 44 includes an insulation portions 44a and conductor portions 44b formed inside the insulation portions 44a. In the insulation portion 44a, any of various organic-based or inorganic-based insulation materials is used. The conductor portion 44b may include a conductor pattern such as a wiring, a via, or a pad. In the conductor portion 44b, any of various conductive materials such as Cu or Al is used.

For example, parts (pads) of the conductor portions 44b of the wiring layer 44 exposed from the insulation portions 44a are used terminals 45. In FIG. 6, two terminals 45 are illustrated as examples.

Figure 7A:
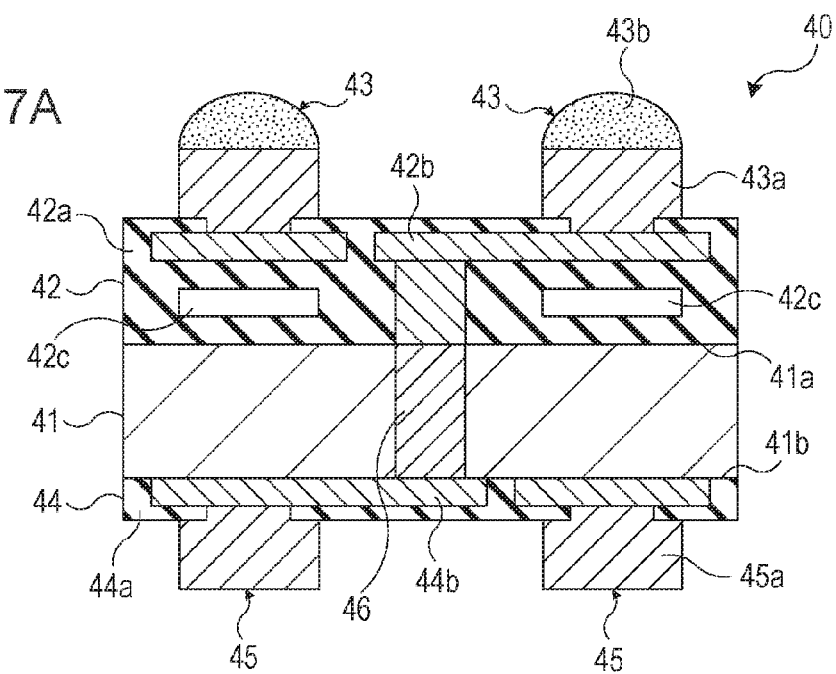
FIGS. 7A and 7B are diagrams illustrating another example of the semiconductor chip according to the second embodiment.
Figure 7B:
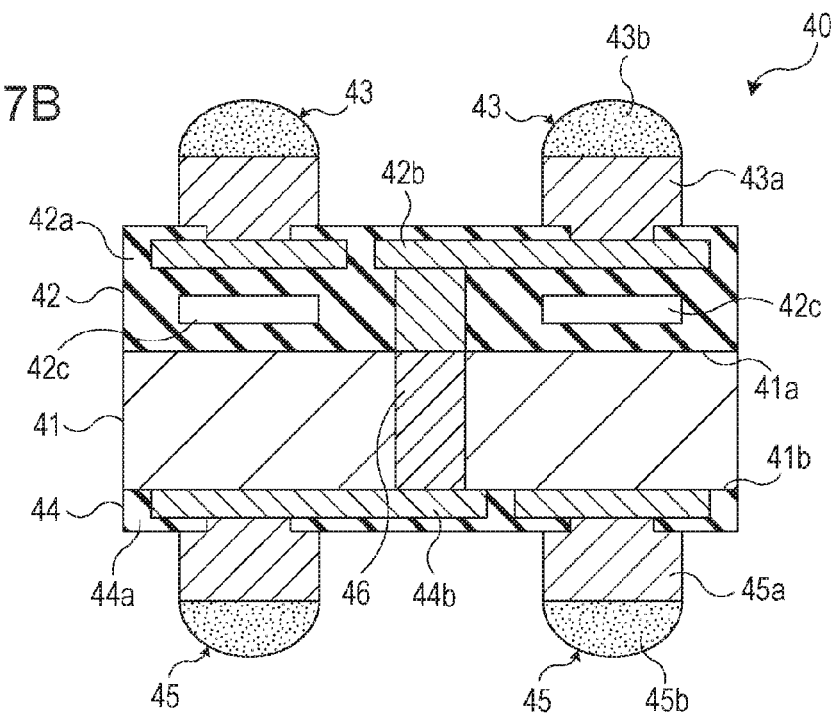

FIGS. 7A and 7B are diagrams illustrating another example of a semiconductor chip according to the second embodiment. FIGS. 7A and 7B schematically illustrate cross-sectional surfaces of main portions in the other example of the semiconductor chip according to the second embodiment.

As the terminal 45 on the side of the wiring layer 44, in addition to the shape illustrated in FIG. 6, a protrusion-shaped terminal including a pillar electrode 45a formed on a part of the conductor portion 44b of the wiring layer 44 or the pillar electrode 45a and a solder 45b formed at the front end of the pillar electrode 45a may be used, as illustrated in FIGS. 7A and 7B.

A TSV 46 penetrated between the front surface 41a and the rear surface 41b is formed inside the semiconductor substrate 41. The conductor portion 42b of the wiring layer 42 formed on the side of the front surface 41a of the semiconductor substrate 41 includes a portion electrically coupled to a circuit element such as a transistor on the side of the front surface 41a and a portion electrically coupled to the TSV 46. The conductor portion 44b of the wiring layer 44 formed on the side of the rear surface 41b of the semiconductor substrate 41 includes a portion electrically coupled to the TSV 46. In FIGS. 6, 7A, and 7B, the conductor portions 42b are schematically illustrated for convenience. However, as described above, the conductor portions 42b may include conductor patterns such as wirings or vias.

Hollow portions 42c are formed inside the insulation portion 42a of the wiring layer 42 formed on the side of the front surface 41a of the semiconductor substrate 41 of the semiconductor chip 40. The hollow portions 42c are hollow, and thus have lower thermal conductivity than the surrounding portions. That is, the hollow portions 42c have the lower thermal conductivity than the thermal conductivity of the insulation portion 42a, or than the thermal conductivity of the wiring layer 42 as including insulation portion 42a and the conductor portions 42b, or than the thermal conductivity of any of the wiring layer 42 as including insulation portion 42a and the conductor portions 42b and the semiconductor substrate 41, or than the thermal conductivity of any of the wiring layer 42 as including insulation portion 42a and the conductor portions 42b, the semiconductor substrate 41, and the wiring layer 44. The terminals 43 are formed at positions corresponding to the hollow portions 42c, that is, above the hollow portions 42c in the example of FIGS. 6, 7A, and 7B.

Next, an example of a method of forming the semiconductor chip 40 having the above-described configuration will be described. FIGS. 8A to 13B are diagrams illustrating an example of the method of forming the semiconductor chip according to the second embodiment. FIGS. 8A to 13B schematically illustrate cross-sectional surfaces of main portions in the other example of the method of forming the semiconductor chip according to the second embodiment.

Figure 8A:
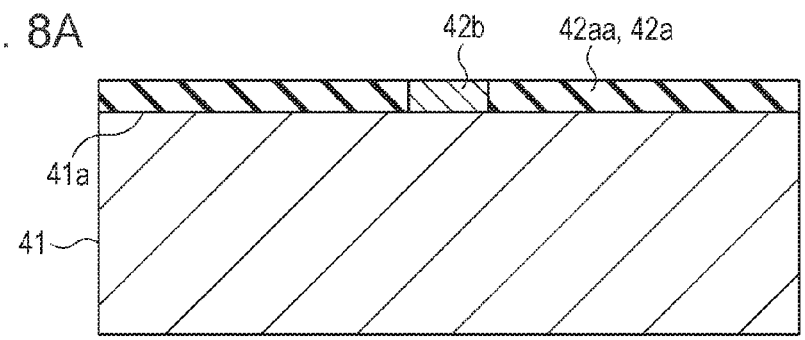
FIGS. 8A to 8C are diagrams (part 1) illustrating an example of a method of forming the semiconductor chip according to the second embodiment.

As illustrated in FIG. 8A, an insulation layer 42aa (a part of the insulation portion 42a) is first formed on the front surface 41a of the semiconductor substrate 41 in which circuit elements such as transistors are formed. For example, a part (a conductor pattern such as a wiring or a via) of the conductor portion 42b is formed inside the insulation layer 42aa. FIG. 8A illustrates an example in which a part of the conductor portion 42b is formed inside the insulation layer 42aa.

Figure 8B:
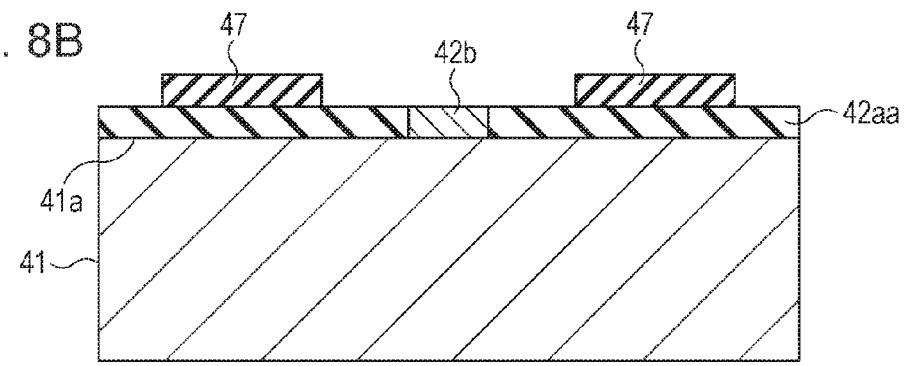

Subsequently, as illustrated in FIG. 8B, sacrifice layers 47 are formed in predetermined regions on the insulation 42aa. In the sacrifice layers 47, there is used a material which may be selectively removed with respect to the insulation layer 42aa and an insulation layer 42ab formed on the insulation layer 42aa, as will be described below. For example, an inorganic-based insulation material such as silicon oxide (SiO), silicon nitride (SiN), or silicon carbide (SiC) is used for the insulation layers 42aa and 42ab, and an organic-based insulation material such as resin is used for the sacrifice layers 47. Alternatively, an organic-based insulation material such as resin is used for the insulation layers 42aa and 42ab and an inorganic-based insulation material such as SiO, SiN, or SiC is used for the sacrifice layer 47.

Figure 8C:
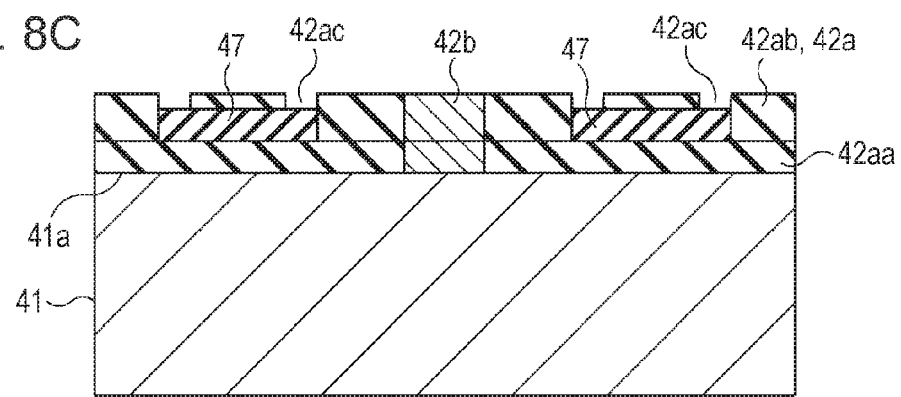
Figure 9:
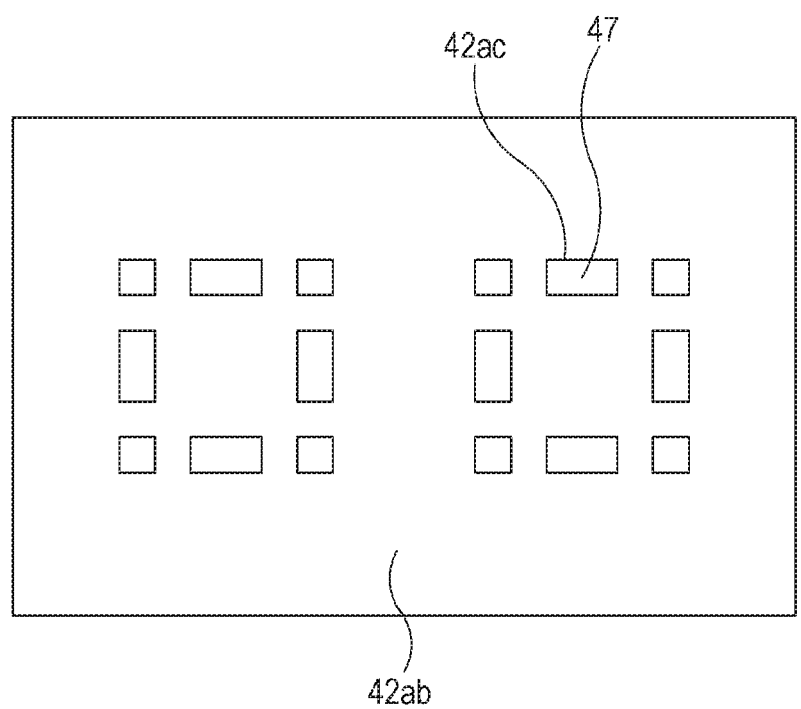
FIG. 9 is a diagram (part 2) illustrating an example of the method of forming the semiconductor chip according to the second embodiment.

Subsequently, as illustrated in FIG. 8C, a predetermined insulation material is used on the insulation layer 42aa and the sacrifice layers 47 to form the insulation layer 42ab (a part of the insulation portion 42a). Openings 42ac leading to the sacrifice layers 47 are formed in the insulation layer 42ab. For example, the openings 42ac are formed at positions leading to a plurality of portions of the sacrifice layer 47 in a plan view, as illustrated in FIG. 9. For example, a part (a conductor pattern such as a wiring or a via) of the conductor portion 42b is formed inside the insulation layer 42ab. FIG. 8C illustrates an example in which the part of the conductor portion 42b is formed inside the insulation layer 42ab.

Figure 10A:
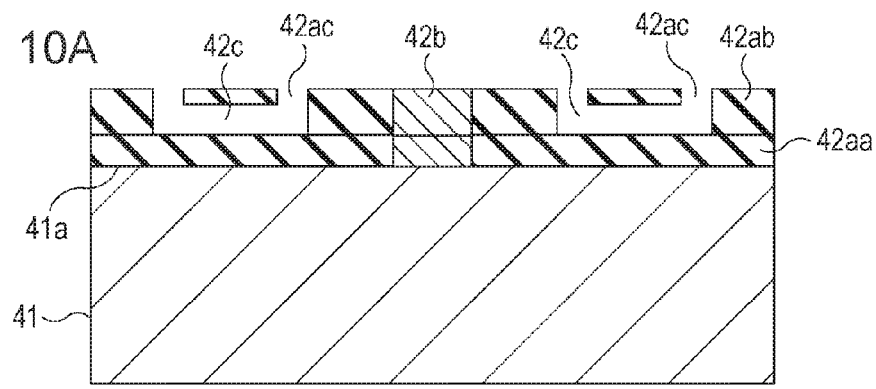
FIGS. 10A to 10C are diagrams (part 3) illustrating an example of the method of forming the semiconductor chip according to the second embodiment.

Subsequently, as illustrated in FIG. 10A, the sacrifice layers 47 are removed through openings 42ac of the insulation layer 42ab. The sacrifice layers 47 are removed by, for example, dry etching. The sacrifice layers 47 may be removed by wet etching. For example, the sacrifice layers 47 are removed by executing etching (dry or wet etching) on the organic-based or inorganic-based insulation material used in the insulation layers 42aa and 42ab under the condition that the organic-based or inorganic-based insulation material used in the sacrifice layers 47 is selectively etched. Alternatively, in a case in which a material which may be dissolved by a predetermined solvent is used for the sacrifice layers 47, for example, in a case in which polymethylmethacrylate which may be dissolved by methylethylketone is used, wet etching is executed using such a predetermined solvent to remove the sacrifice layers 47.

By removing the sacrifice layers 47 through the openings 42ac of the insulation layer 42ab, the hollow portions 42c communicating with the openings 42ac are formed inside the insulation layer 42ab.

Figure 10B:
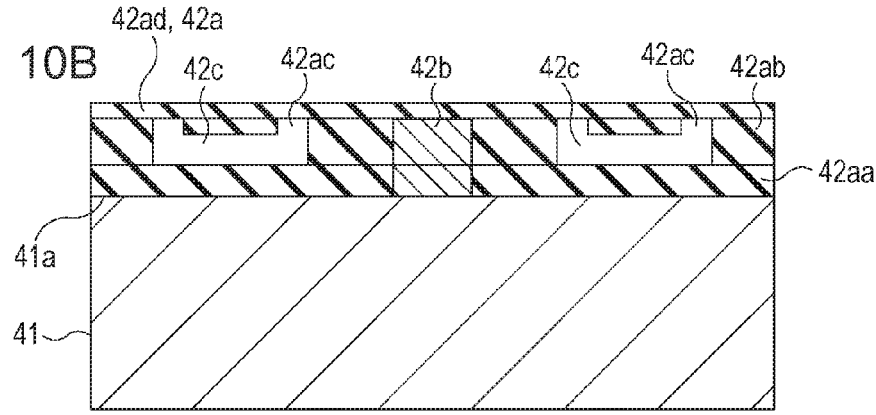

Subsequently, as illustrated in FIG. 10B, a cap film 42ad (a part of the insulation portion 42a) is formed on the insulation layer 42ab using a predetermined insulation material so that the openings 42ac and the hollow portions 42c communicating with the openings 42ac are covered.

Figure 10C:
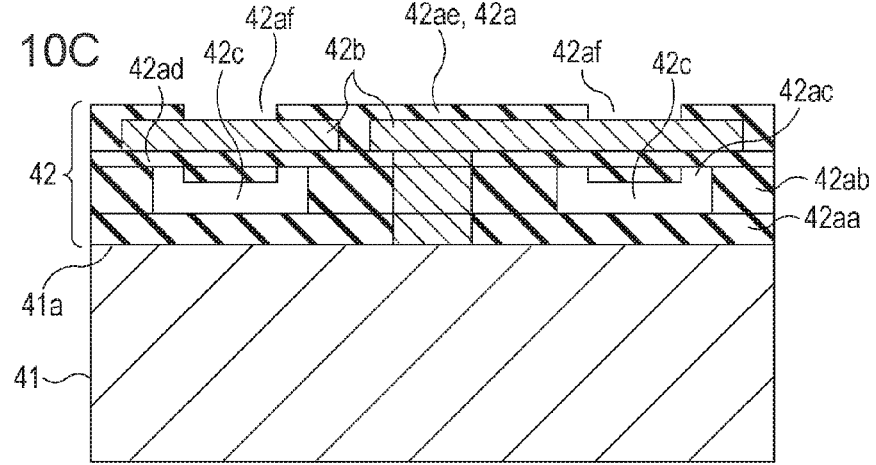

Subsequently, as illustrated in FIG. 10C, parts (conductive patterns such as wirings or vias) of the conductor portions 42b are formed inside the cap film 42ad and on the cap film 42ad. Further, a passivation film 42ae (a part of the insulation portion 42a) is formed on the cap film 42ad using a predetermined insulation material and openings 42af leading to parts of the conductor portions 42b are formed. Parts of the conductor portions 42b on the cap film 42ad and the openings 42af leading to these parts are formed above the hollow portions 42c. Part of the conductor portions 42b exposed form the openings 42af is used as pads (electrodes) in which the terminals 43 are formed, as will be described below. Thus, the wiring layer 42 is formed on the side of the front surface 41a of the semiconductor substrate 41.

Figure 11A:
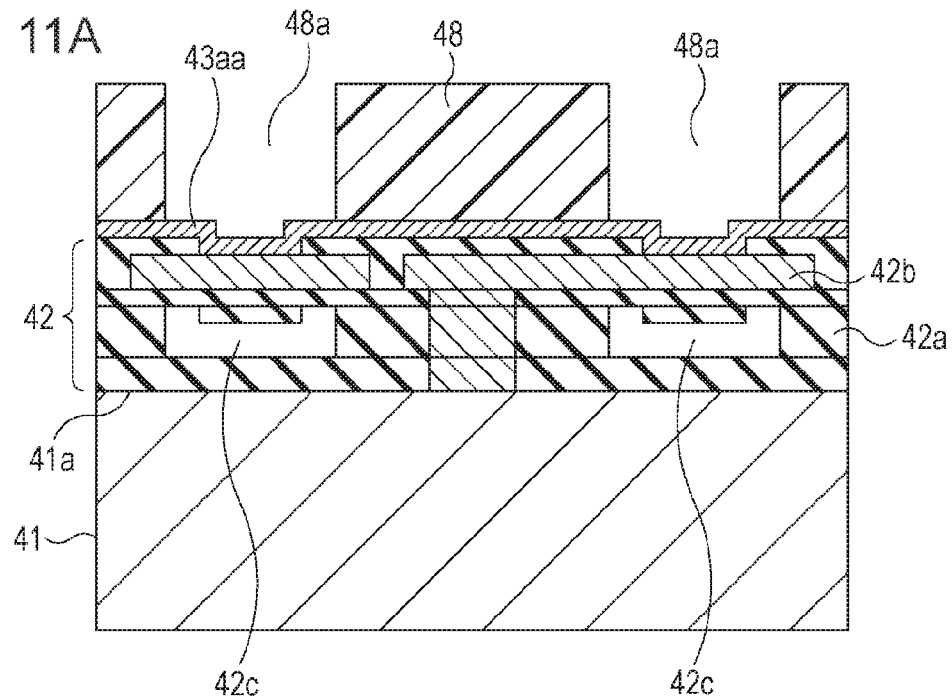
FIGS. 11A and 11B are diagrams (part 4) illustrating an example of the method of forming the semiconductor chip according to the second embodiment.

Subsequently, as illustrated in FIG. 11A, a seed layer 43aa is formed. For example, titanium (Ti) and Cu are each formed with a predetermined film thickness as the seed layer 43aa. Further, as illustrated in FIG. 11A, a resist 48 that has openings 48a above at least parts of the hollow portions 42c is formed. The diameter of the opening 48a of the resist 48 is set based on the diameter of the terminal 43 to be formed and the planar size of the hollow portion 42c (a relation between the diameter of the terminal 43 and the planar size of the hollow portion 42c).

Figure 11B:
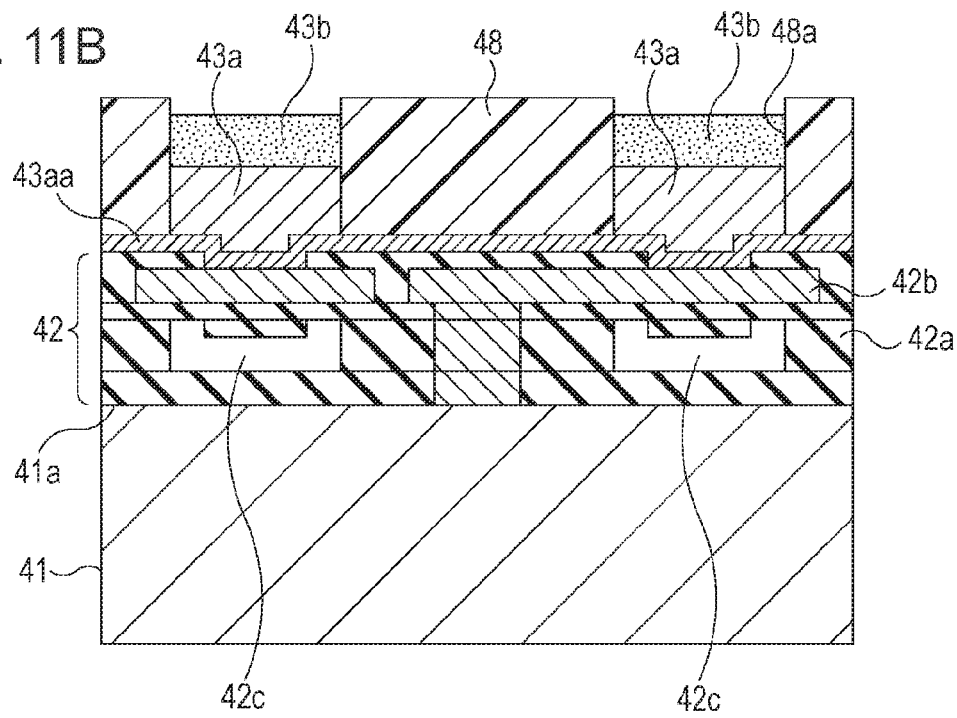

Subsequently, as illustrated in FIG. 11B, the pillar electrodes 43a and the solders 43b are each formed with a predetermined film thickness inside the openings 48a using the resist 48 as a mask through electroplating using the seed layer 43aa as a power feed layer. The pillar electrodes 43a are formed by, for example, Cu electroplating. The solders 43b are formed by, for example, tin (Sn)-silver (Ag) solder electroplating.

Figure 12A:
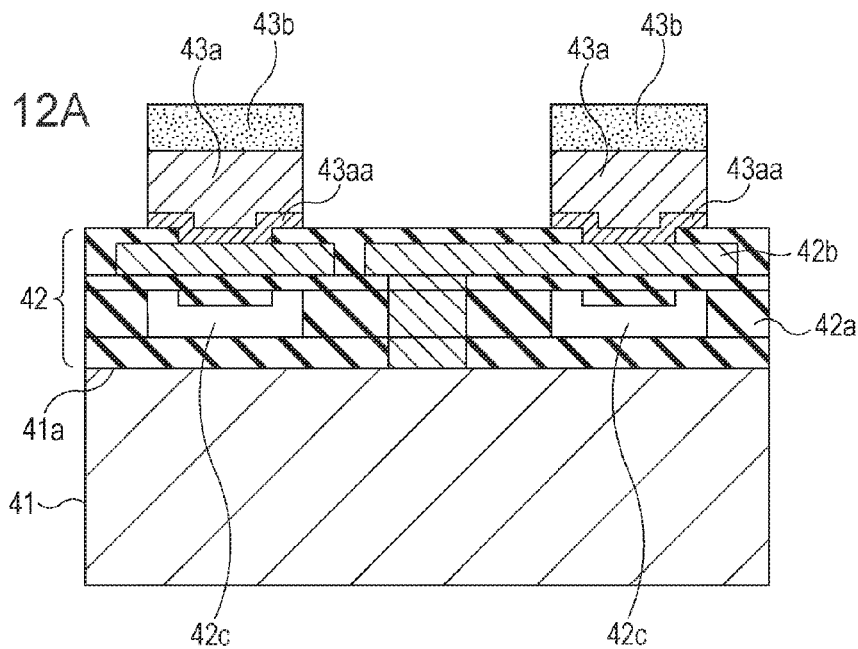
FIGS. 12A and 12B are diagrams (part 5) illustrating an example of the method of forming the semiconductor chip according to the second embodiment.
Figure 12B:
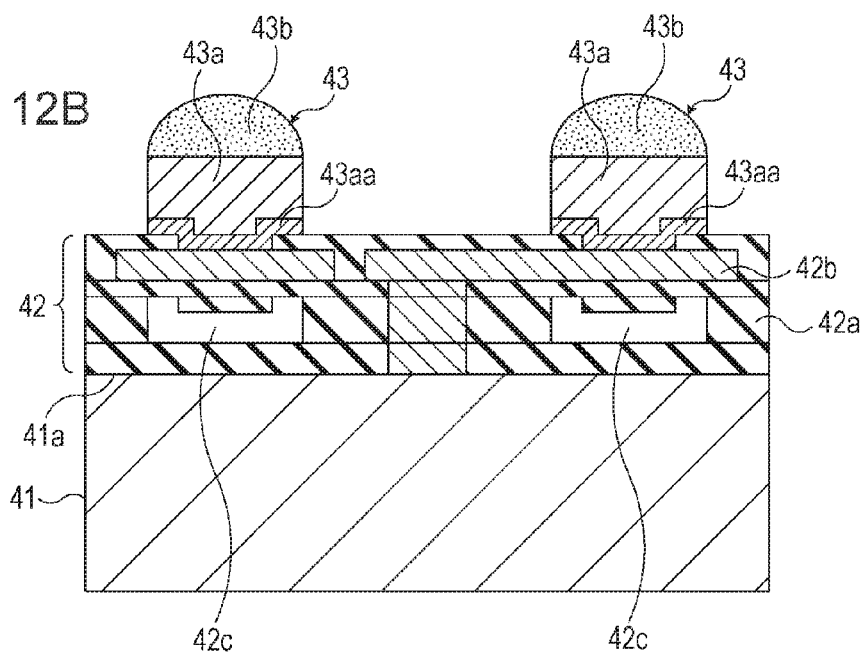

Subsequently, as illustrated in FIG. 12A, the resist 48 is removed and the seed layer 43aa exposed after the removing of the resist 48 is removed. Subsequently, as illustrated in FIG. 12B, the solders 43b are heated and melted by wet back to form the terminals 43 including the solders 43b with round shapes on the pillar electrodes 43a.

Figure 13A:
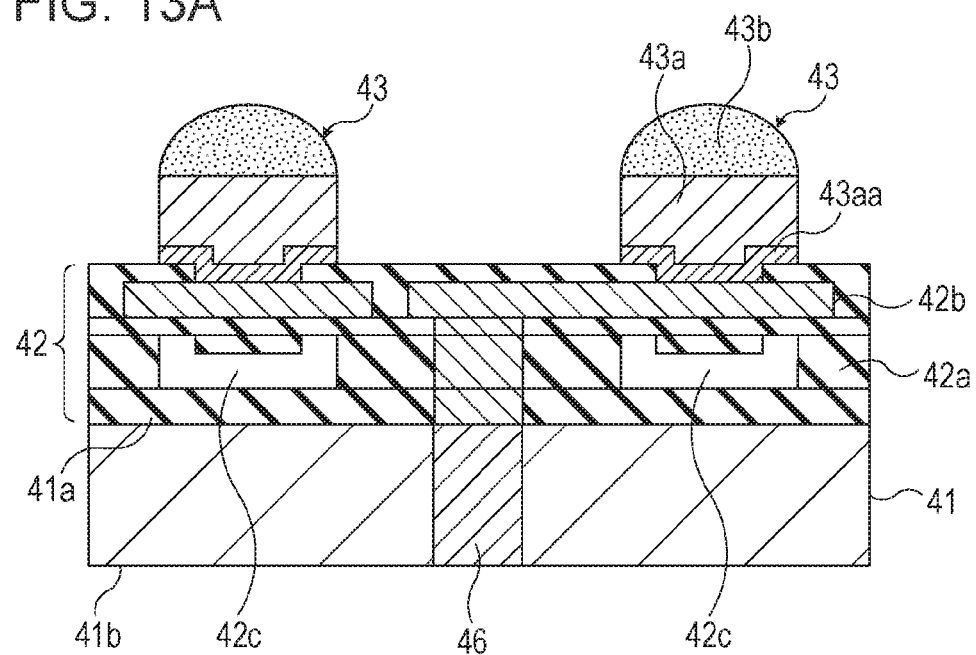
FIGS. 13A and 13B are diagrams (part 6) illustrating an example of the method of forming the semiconductor chip according to the second embodiment.

For example, after these terminals 43 are formed, the side of the surface on which the terminals 43 are formed is protected by a protection film or the like and the semiconductor substrate 41 is subjected to back grinding from the side of the rear surface 41b to be thinned up to a predetermined thickness. Then, as illustrated in FIG. 13A, the TSV 46 penetrated through the semiconductor substrate 41 and coupled to parts of the conductor portions 42b of the wiring layer 42 is formed using a deep-mining etching technology and a plating technology.

Figure 13B:
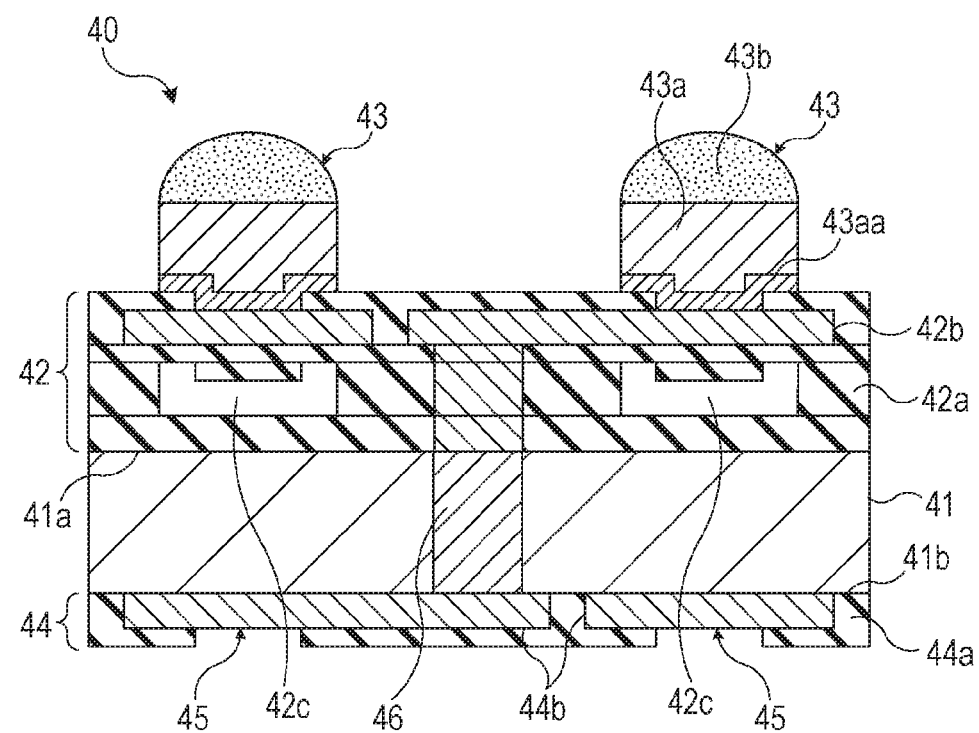

The wiring layer 44 including the insulation portion 44a and the conductor portion 44b is formed on the rear surface 41b of the semiconductor substrate 41 in which the TSV 46 is formed, as illustrated in FIG. 13B. For example, the wiring layer 44 is formed by forming the conductor portion 44b coupled to the TSV 46 on the rear surface 41b of the semiconductor substrate 41 in which the TSV 46 is formed, forming the insulation portion 44a, and further forming openings leading to parts of the conductor portion 44b in the insulation portion 44a.

For example, parts of the conductor portion 44b exposed from the insulation portion 44a in the wiring layer 44 formed in this way are used as the terminals 45. In a case in which the protrusion-shaped terminals 45 illustrated in FIGS. 7A and 7B are formed in the wiring layer 44, the pillar electrodes or the pillar electrodes and the solders may be formed as in the examples of FIGS. 11A, 11B, 12A, and 12B. The semiconductor chip 40 is formed in accordance with the above-described processes.

The method of forming the semiconductor chip 40, as illustrated in FIGS. 8A to 13B, is merely an example. The method of forming the semiconductor chip 40 is not limited to the method exemplified herein.

For example, in the foregoing example, the case has been described in which the TSV 46 is formed from the side of the rear surface 41b after the wiring layer 42 and the terminals 43 are formed on the side of the front surface 41a of the semiconductor substrate 41 and before the wiring layer 44 is formed on the side of the rear surface 41b of the semiconductor substrate 41. Additionally, the following method may also be used. That is, before or while the wiring layer 42 is formed, a TSV electrode reaching from the side of the front surface 41a of the semiconductor substrate 41 to the inside of the semiconductor substrate 41 is formed using a deep-mining etching technology and a plating technology. Then, after the wiring layer 42 and the terminals 43 on the side of the front surface 41a are formed, the semiconductor substrate 41 is subjected to back grinding and an TSV electrode is exposed to the side of the rear surface 41b. The exposed electrode is used as the TSV 46. The wiring layer 44 and the terminals 45 are formed on the side of the rear surface 41b of the semiconductor substrate 41 in which the TSV 46 is formed. The semiconductor chip 40 may be formed using such a method.

Subsequently, a process of stacking the above-described semiconductor chip 40 will be described. FIGS. 14A to 15B are diagrams illustrating an example of a semiconductor chip stacking process according to the second embodiment. FIGS. 14A, 14B, 15A, and 15B schematically illustrate cross-sectional surfaces of main portions in the example of the semiconductor chip stacking process according to the second embodiment.

Figure 14A:
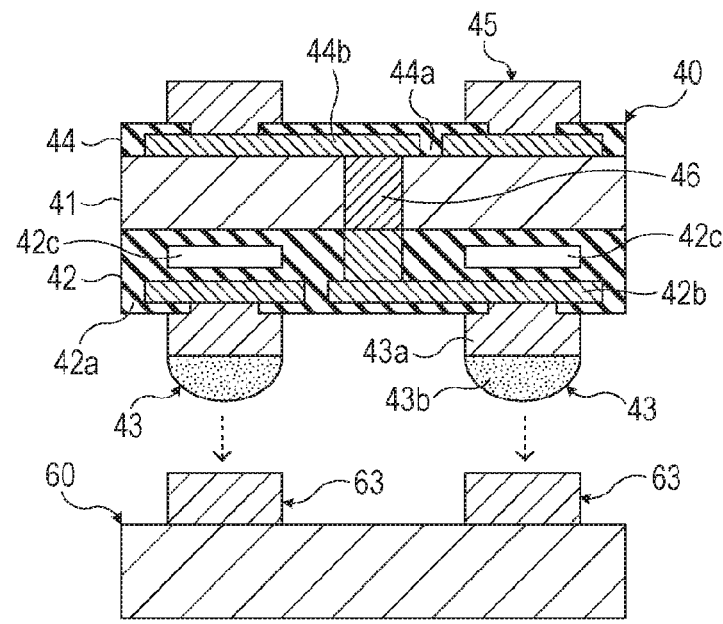
FIGS. 14A and 14B are diagrams (part 1) illustrating an example of a semiconductor chip stacking process according to the second embodiment.
Figure 14B:
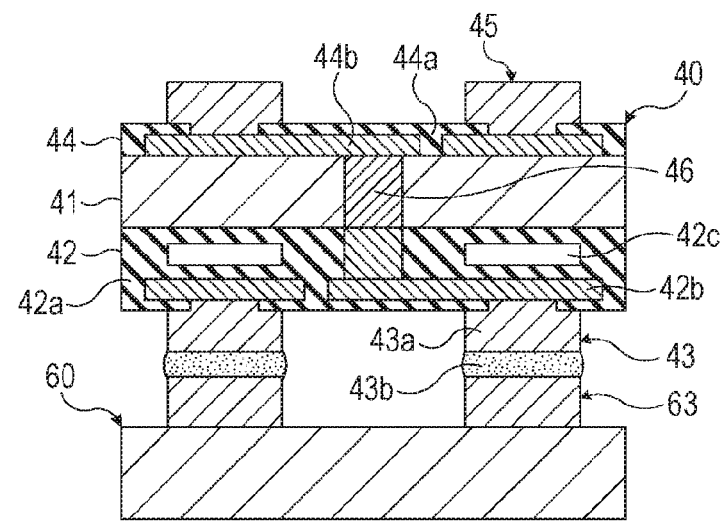

For example, as illustrated in FIGS. 14A and 14B, the semiconductor chip 40 is stacked on an electronic component 60. As the electronic component 60, for example, a semiconductor chip, a semiconductor package, or a circuit substrate (a printed substrate, an interposer, or the like) may be used. Here, a case will be exemplified in which pillar electrodes which are terminals 63 are formed on the side of the surface of the electronic component 60 on which the semiconductor chip 40 is stacked. The terminals 43 of the semiconductor chip 40 and the terminals 63 of the electronic component 60 are formed at positions corresponding to each other.

In stacking of the semiconductor chip 40 on the electronic component 60, as illustrated in FIG. 14A, the terminals 63 of the electronic component 60 are first faced to the terminals 43 of the semiconductor chip 40. Then, as illustrated in FIG. 14B, the terminals 63 and 43 are bonded by executing heating at a temperature at which the solders 43b included in the terminals 43 of the semiconductor chip 40 are melted. The heating at the time of the bonding may not inevitably be executed on the side of the semiconductor chip 40.

Figure 15A:
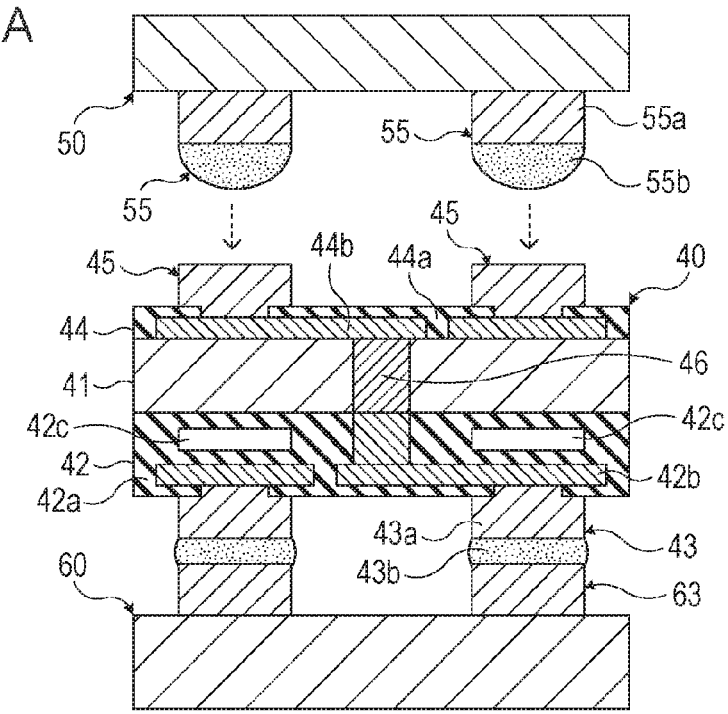
FIGS. 15A and 15B are diagrams (part 2) illustrating an example of a semiconductor chip stacking process according to the second embodiment.
Figure 15B:
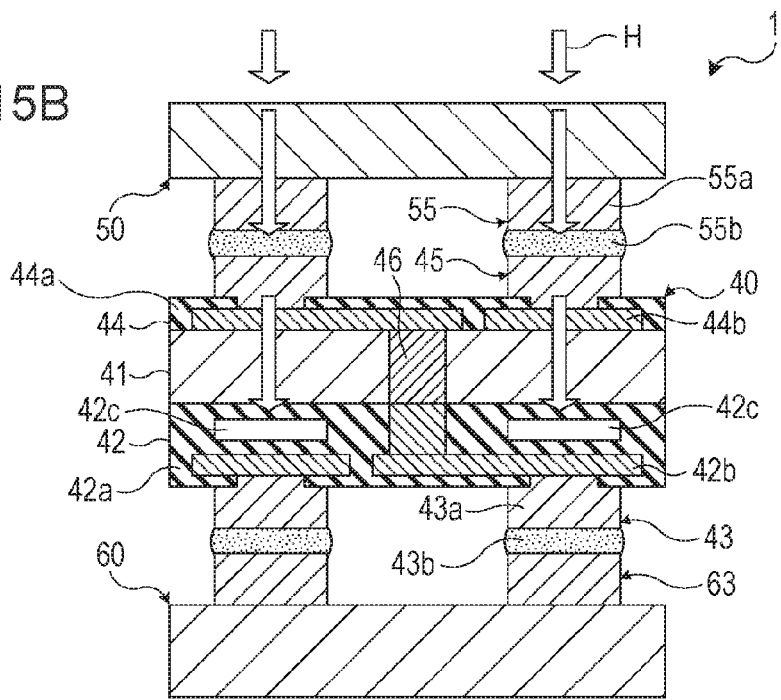

As illustrated in FIGS. 15A and 15B, a semiconductor chip 50 is further stacked on the stack body of the electronic component 60 and the semiconductor chip 40 illustrated in FIG. 14B. Here, a case will be exemplified in which the pillar electrodes are formed as the terminals 45 on the side of the surface of the semiconductor chip 40 on which the semiconductor chip 50 is stacked. In the semiconductor chip 50, terminals 55 including pillar electrodes 55a and solders 55b formed at the front ends of the pillar electrodes 55a are formed at positions corresponding to the terminals 45 of the semiconductor chip 40.

In the stacking of the semiconductor chip 50 on the semiconductor chip 40, as illustrated in FIG. 15A, the terminals 55 of the semiconductor chip 50 are first faced to the terminals 45 of the semiconductor chip 40. Then, as illustrated in FIG. 15B, the terminals 55 and 45 are bonded by executing heating at a temperature at which the solders 55b included in the terminals 55 of the semiconductor chip 50 are melted. The heating at the time of the bonding is executed on the side of the semiconductor chip 50 in order to suppress heat transfer to bonded portions (the solders 43b) of the electronic component 60 and the semiconductor chip 40 which have already been formed. This is because there is a possibility of alloying of the solders 43b progressing, the alloying which results in bonding defects, when the heating is executed from the opposite side of the electronic component 60 or the electronic component 60, the semiconductor chip 40, and the semiconductor chip 50 as a whole.

In FIG. 15B, heating (heat H) executed on the side of the semiconductor chip 50 to be stacked is schematically indicated by thick arrows for convenience. As illustrated in FIG. 15B, the heat H given from the side of the semiconductor chip 50 at the time of the bonding is transferred to the solders 55b to melt the solders 55b. Thus, the terminals 55 of the semiconductor chip 50 are bonded to the terminals 45 of the semiconductor chip 40.

The heat H given from the side of the semiconductor chip 50 at the time of the bonding may further be transferred from the portions of the terminals 55 and 45 to the side of the terminals 43 through the inside of the semiconductor chip 40. Even in a case in which the heat transfer occurs, the heat transfer to the terminals 43 is suppressed because the hollow portions 42c having relatively low thermal conductivity are formed along the heat transfer path to the terminals 43 in the semiconductor chip 40. Since the heat transfer to the terminals 43 is suppressed by the hollow portions 42c, the alloying of the terminals 43, that is, the alloying of the solders 43b caused due to component diffusion between the solders 43b and the pillar electrodes 43a or the solders 43b and the terminals 63 is suppressed, and thus a bonding defect between the terminals 43 and 63 is suppressed. Thus, an electronic apparatus 1 that has a 3-dimensional stack structure of the electronic component 60, the semiconductor chip 40, and the semiconductor chip 50 is realized.

Figure 16:
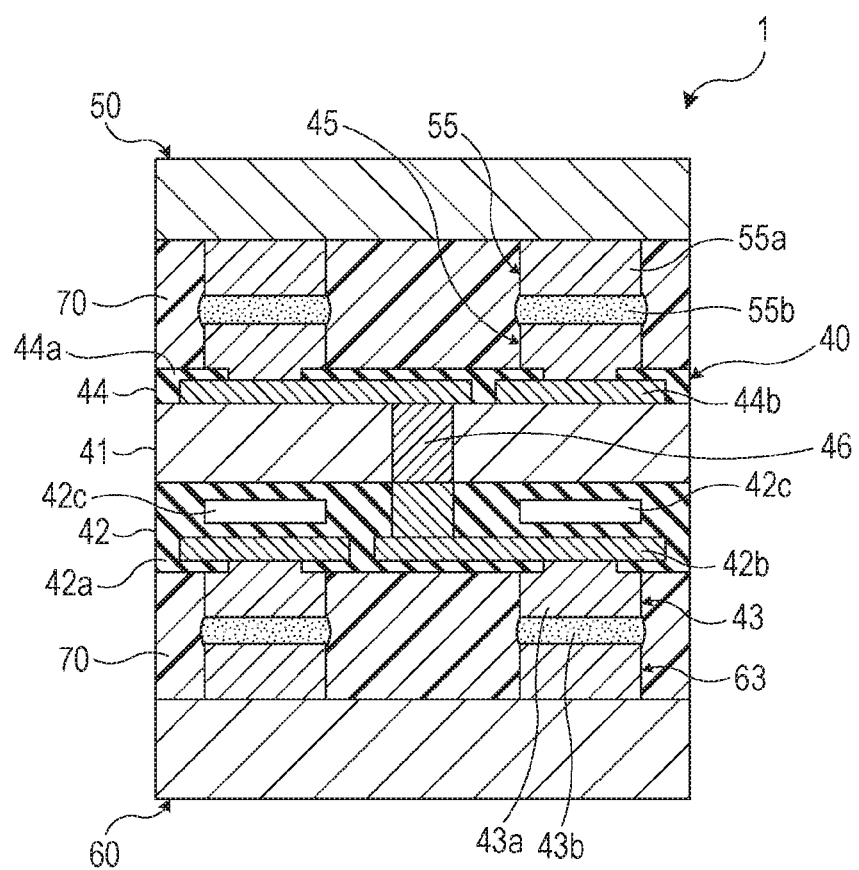
FIG. 16 is a diagram illustrating another example of an electronic apparatus according to the second embodiment.

FIG. 16 is a diagram illustrating another example of an electronic apparatus according to the second embodiment. FIG. 16 schematically illustrates cross-sectional surfaces of main portions in the other example of the electronic apparatus according to the second embodiment.

For example, as illustrated in FIG. 16, resin layers 70 such as underfill resins may be formed between the bonded electronic component 60 and semiconductor chip 40 and the bonded semiconductor chips 40 and 50. When the resin layers 70 are formed, it is possible to achieve an improvement in the bonding strength between the electronic component 60 and the semiconductor chip 40 which are bonded to each other and between the semiconductor chips 40 and 50 which are bonded to each other.

Another semiconductor chip (not illustrated) may be further stacked on the semiconductor chip 50 stacked on the semiconductor chip 40 in the electronic apparatus 1 illustrated in FIG. 15B or 16. In this case, for example, as in the semiconductor chip 40, hollow portions may be formed in the semiconductor chip 50 and the terminals 55 may be formed at positions corresponding to the hollow portions. In a case in which the hollow portions are formed in the semiconductor chip 50 in this way, heating is at a higher temperature than in a case in which no hollow portion is formed when the heating is executed from the side of the semiconductor chip 50 at the time of the bonding, as illustrated in FIGS. 15A and 15B. Thus, the heat H given from the side of the semiconductor chip 50 is transferred to the terminals 55, and thus the solders 55b are melted.

In a case in which another semiconductor chip is further stacked on the semiconductor chip 50 stacked on the semiconductor chip 40, heat transfer to the bonded portions (the solders 55b) of the semiconductor chips 50 and 40 which have already been formed is suppressed when hollow portions are formed in the semiconductor chip 50. The heat transfer to the bonded portions (the solders 43b) of the semiconductor chip 40 and electronic component 60 which have already been formed is suppressed by the hollow portions 42c formed in the semiconductor chip 40, as described above.

Thereafter, when the configuration which has hollow portions is adopted even in a semiconductor chip to be stacked in an upper layer, it is possible to obtain the advantage of suppressing heat transfer to bonded portions of lower layers which have already been formed. Thus, it is possible to realize an electronic apparatus with a high capability and high quality in which bonding defects between the stacked semiconductor chips and between the stacked semiconductor chip and electronic component are suppressed.

The stacked semiconductor chips or electronic components (the foregoing semiconductor chips 40 and 50 and the electronic component 60) may be separated chips or components or may be chips or components before separation. That is, the staked semiconductor chips or electronic components may be formed in a chip on chip (COC) shape, a wafer on wafer (WOW) shape, or a chip on wafer (COW) shape.

Next, a result obtained by making an analysis by a simulation in relation to the semiconductor chip 40 in which the above-described hollow portions 42c are formed will be described. An analysis model using a simulation according to the second embodiment is illustrated in FIGS. 17A to 17C.

Figure 17A:
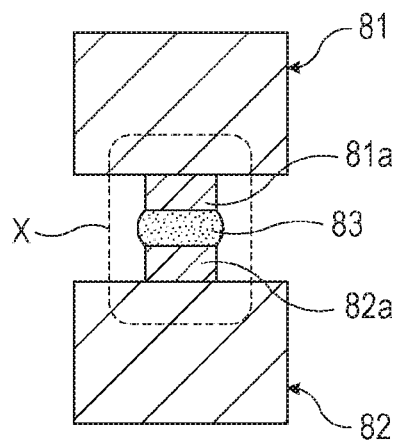
FIGS. 17A to 17C are diagrams illustrating an analysis model using a simulation according to the second embodiment.

In the simulation, as illustrated in FIG. 17A, a one-terminal model that has a so-called face-to-face structure in which a pillar electrode 81a and a pillar electrode 82a of two semiconductor chips 81 and 82 are bonded to each other by a solder 83 was used. In regard to an X portion which includes bonded portions of the solder 83 in the one-terminal model, a reference analysis model 80A in which no hollow portion is formed, as illustrated in FIG. 17B, and an analysis model 80B in which a hollow portion 81b is formed in one semiconductor chip 81, as illustrated in FIG. 17C, were prepared.

Figure 17B:
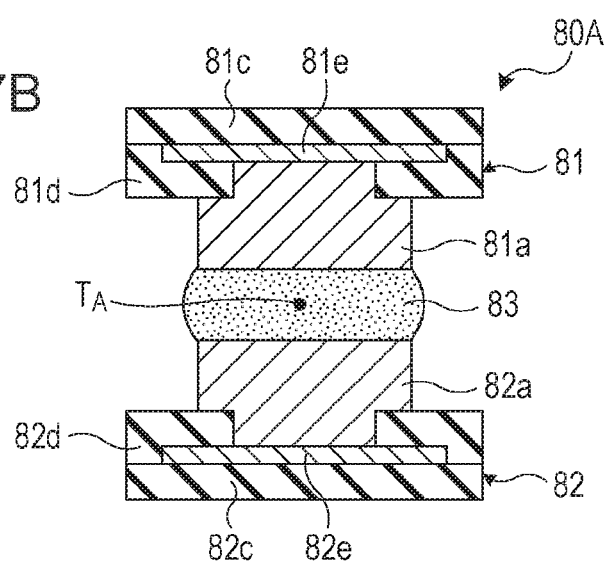

Here, the analysis model 80A of FIG. 17B includes a semiconductor chip 81 in which a conductor portion 81e is formed inside an insulation portion 81d on an insulation portion 81c formed on a semiconductor substrate and a pillar electrode 81a is formed on a part (pad) of the conductor portion 81e exposed from the insulation portion 81d. Further, the analysis model 80A includes a semiconductor chip 82 in which a conductor portion 82e is formed inside an insulation portion 82d on an insulation portion 82c formed on a semiconductor substrate and a pillar electrode 82a is formed on a part (pad) of the conductor portion 82e exposed from the insulation portion 82d. The analysis model 80A has a structure in which the pillar electrode 81a of the semiconductor chip 81 is bonded to the pillar electrode 82a of the semiconductor chip 82 by a solder 83.

Figure 17C:
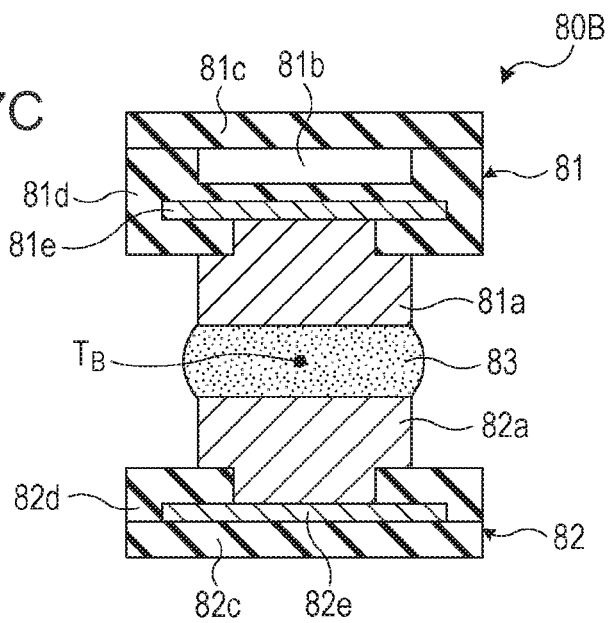

The analysis model 80B of FIG. 17C includes a semiconductor chip 81 in which a hollow portion 81b and a conductor portion 81e are formed inside an insulation portion 81d on an insulation portion 81c formed on a semiconductor substrate and a pillar electrode 81a is formed on a part (pad) of the conductor portion 81e exposed from the insulation portion 81d. The pillar electrode 81a is formed at a position corresponding to the hollow portion 81b. The analysis model 80B further includes a semiconductor chip 82 in which a conductor portion 82e is formed inside an insulation portion 82d on an insulation portion 82c formed on a semiconductor substrate and a pillar electrode 82a is formed on a part (pad) of the conductor portion 82e exposed from the insulation portion 82d. The analysis model 80B has a structure in which the pillar electrode 81a of the semiconductor chip 81 is bonded to the pillar electrode 82a of the semiconductor chip 82 by a solder 83.

As conditions of the simulation in which the analysis models 80A and 80B are used, the semiconductor chip 81 is assumed to be formed on the side of a bonding head of a real machine and the semiconductor chip 82 is assumed to be formed on the side of a stage of the real machine. Then, a temperature on the side of the semiconductor chip 81 close to the bonding head was set to 340° C. and a temperature on the side of the semiconductor chip 82 close to the stage was set to 140° C. Further, the thickness of the semiconductor substrate used in the semiconductor chip 81 on the side of the bonding head was set to 550 µm.

As a result of the simulation, while a temperature $T_A$ of the solder 83 was 240° C. in the analysis model 80A in which the hollow portion 81b was not formed, a temperature $T_B$ of the solder 83 was 158.7° C. in the analysis model 80B in which the hollow portion 81b is formed. In the analysis model 80B in which the hollow portion 81b was formed, the temperature was confirmed to be lower by about 80° C. than in the analysis model 80A in which the hollow portion 81b is not formed in regard to heat given from the upper side of the semiconductor chip 81 (the side of the semiconductor substrate used therein).

From this fact, by forming the hollow portion 42c as in the semiconductor chip 40, it may say that an increase in the temperature of the solder 43b of the bonded portion with the electronic component 60 is suppressed against the heat H given from the side of the stacked semiconductor chip 50, and the alloying of the solder 43b may be effectively suppressed.

Figure 18A:
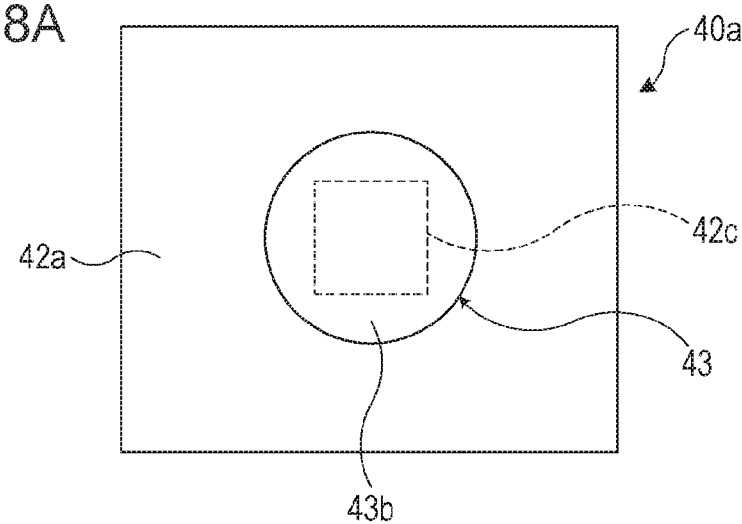
FIGS. 18A to 18C are diagrams illustrating an example of a semiconductor chip according to a third embodiment.
Figure 18B:
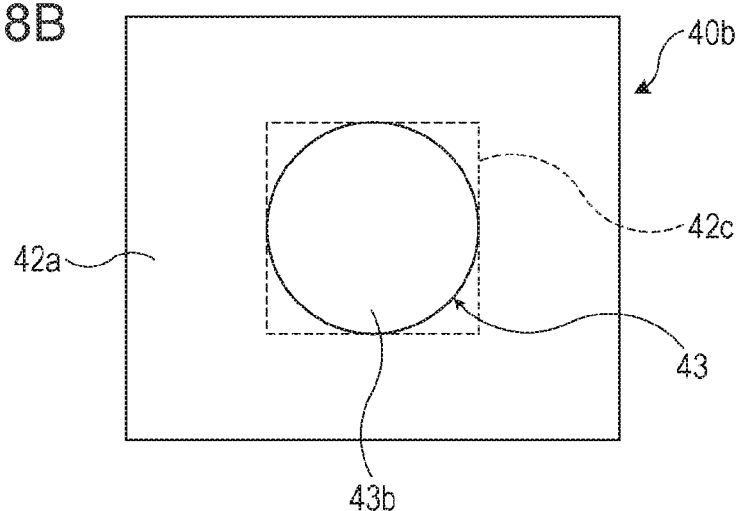
Figure 18C:
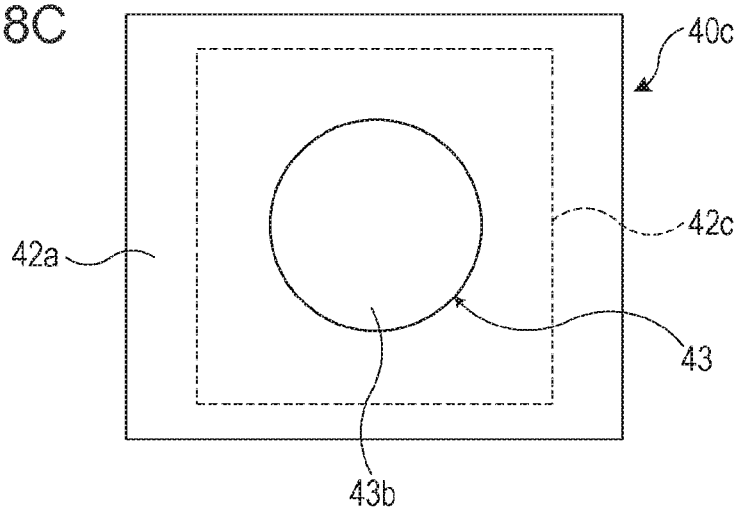

Next, a third embodiment will be described. FIGS. 18A to 18C are diagrams illustrating an example of a semiconductor chip according to the third embodiment. FIGS. 18A to 18C schematically illustrate the planar layout of main portions in the example of the semiconductor chip according to the third embodiment.

A semiconductor chip 40a illustrated in FIG. 18A, a semiconductor chip 40b illustrated in FIG. 18B, and a semiconductor chip 40c illustrated in FIG. 18C all have the same configuration as the semiconductor chip 40 according to the second embodiment, but planar sizes of hollow portions 42c (indicated by dotted lines) are different from each other. Here, the semiconductor chips 40a, 40b, and 40c in which the planar sizes (the lengths of sides) of the hollow portions 42c are less than, the same or substantially the same as, and greater than the diameter of the terminal 43 formed above the hollow portions 42c are exemplified.

As in the semiconductor chips 40a, 40b, and 40c, the hollow portions 42c may be set to have any planar size. For example, the planar sizes of the hollow portions 42c are adjusted based on temperature of heat H given from the side of the surface opposite to the terminal 43, as described above. As the planar size of the hollow portion 42c with a definite depth is larger, the volume of the hollow portion 42c increases. Therefore, it is possible to improve the advantage of suppressing the heat transfer to the terminal 43.

Here, the planar shape of the hollow portion 42c is set to be rectangular. However, the planar shape of the hollow portion 42c is not limited to the rectangular state, but may be set to any shape such as a circular shape, an elliptical shape, or a triangular shape.

The planar size and shape of the hollow portion 42c may be adjusted in accordance with, for example, the planar size and shape of the sacrifice layer 47 formed on the insulation layer 42aa in the process of FIG. 8B described in the second embodiment. The other processes may be executed in the same ways as those described according to the second embodiment.

Figure 19A:
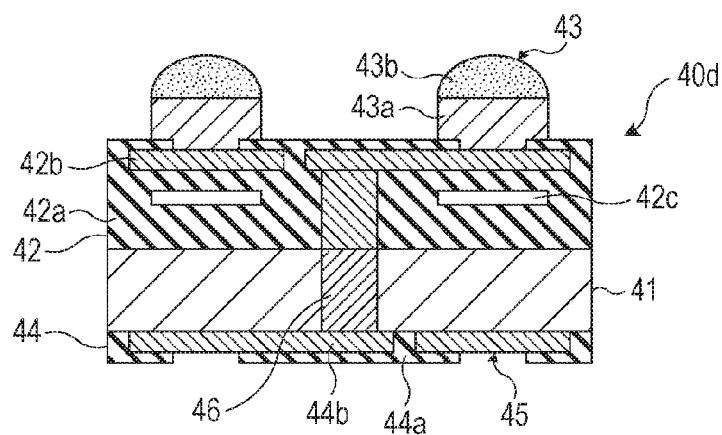
FIGS. 19A to 19C are diagrams illustrating an example of a semiconductor chip according to a fourth embodiment.
Figure 19B:
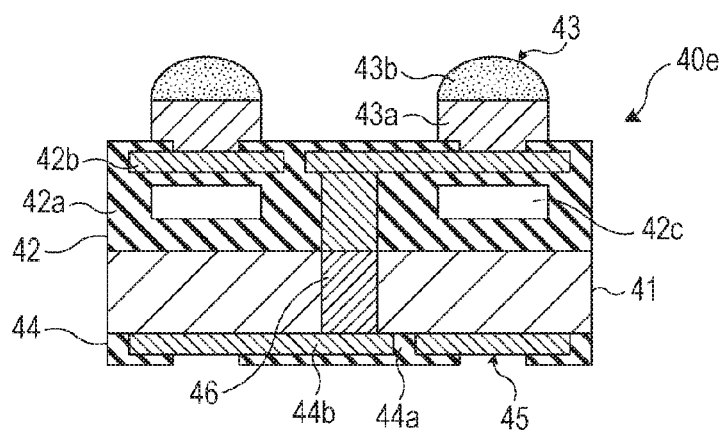
Figure 19C:
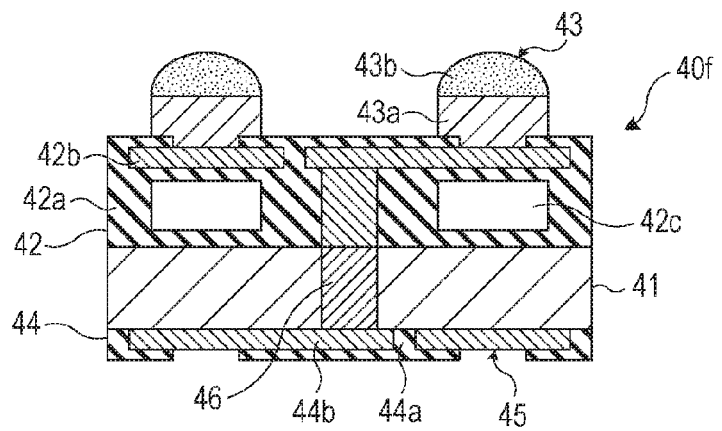

Next, a fourth embodiment will be described. FIGS. 19A to 19C are diagrams illustrating an example of a semiconductor chip according to the fourth embodiment. FIGS. 19A to 19C schematically illustrate cross-sectional surfaces of main portions in the example of the semiconductor chip according to the fourth embodiment.

A semiconductor chip 40d illustrated in FIG. 19A, a semiconductor chip 40e illustrated in FIG. 19B, and a semiconductor chip 40f illustrated in FIG. 19C all have the same configuration as the semiconductor chip 40 according to the second embodiment, but the depths of hollow portions 42c are different from each other. Here, the semiconductor chip 40d in which the hollow portion 42c has a shallow depth, the semiconductor chip 40e in which the hollow portion 42c has an intermediate depth, and the semiconductor chip 40f in which the hollow portion 42c has a deep depth are exemplified.

As in the semiconductor chips 40d, 40e, and 40f, the hollow portions 42c may be set to have any depth. For example, the depths of the hollow portions 42c are adjusted based on temperature of heat H given from the side of the surface opposite to the terminal 43, as described above. As the depth of the hollow portion 42c with a definite planar size and shape is deeper, the volume of the hollow portion 42c increases. Therefore, it is possible to improve the advantage of suppressing the heat transfer to the terminal 43.

The depth of the hollow portion 42c may be adjusted in accordance with, for example, the thickness of the sacrifice layer 47 formed on the insulation layer 42aa in the process of FIG. 8B and the thickness of the insulation layer 42ab in the process of FIG. 8C described in the second embodiment. The other processes may be executed in the same ways as those described according to the second embodiment.

Figure 20:
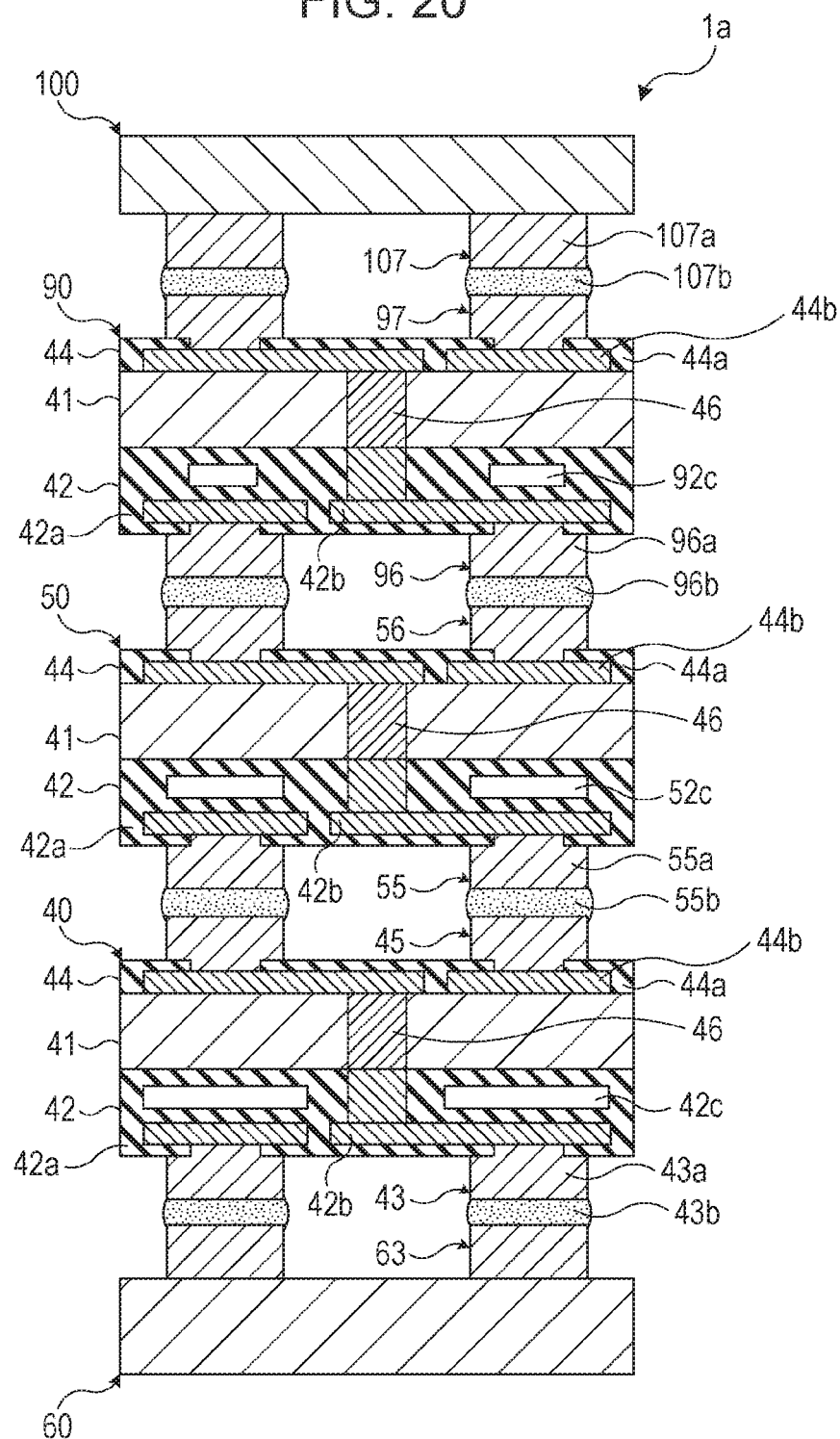
FIG. 20 is a diagram (part 1) illustrating an example of an electronic apparatus according to a fifth embodiment.
Figure 21:
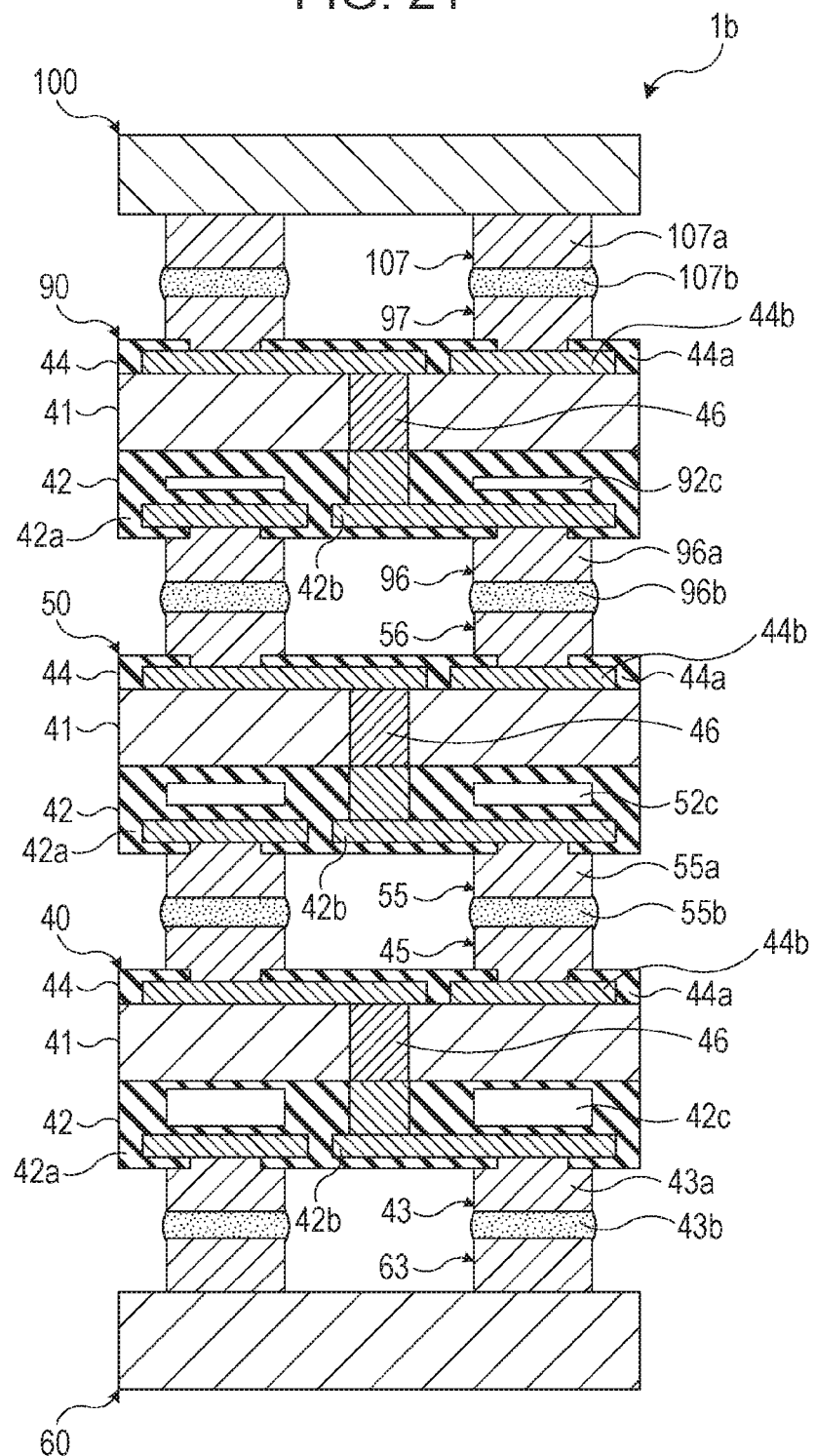
FIG. 21 is a diagram (part 2) illustrating an example of an electronic apparatus according to the fifth embodiment.

Next, a fifth embodiment will be described. FIGS. 20 and 21 are diagrams illustrating examples of electronic apparatuses according to a fifth embodiment. FIGS. 20 and 21 schematically illustrate cross-sectional surfaces of main portions in the example of the electronic apparatus according to the fifth embodiment.

An electronic apparatus is illustrated in FIG. 20 has a 3-dimensional stack structure in which semiconductor chips 40 and 50 are stacked on the electronic component 60 and semiconductor chips 90 and 100 are further stacked.

As described above in the second embodiment, the semiconductor chip 40 includes the hollow portions 42c and the terminals 43 are formed to correspond to the hollow portions 42c. The semiconductor chips 50 and 90 also similarly include hollow portions 52c and 92c inside the insulation portions 42a of the wiring layer 42, respectively. Both of the hollow portions 52c and 92c have lower thermal conductivity than the surroundings of the hollow portions 52c and 92c. That is, the hollow portions 52c and 92c have lower thermal conductivity than the thermal conductivity of the insulation portions 42a or than the thermal conductivity of the wiring layers 42 (42a and 42b) or than the thermal conductivity of any of the wiring layers 42 (42a and 42b) and the semiconductor substrates 41, or than the thermal conductivity of any of the wiring layers 42 (42a and 42b), the semiconductor substrate 41, and the wiring layers 44.

In the semiconductor chip 50, the terminals 55 (pillar electrodes 55a and solders 55b) are formed to correspond to the hollow portions 52c, and terminals 56 are formed on the side of the surface on which the semiconductor chip 90 is stacked. In the semiconductor chip 90, the terminals 96

(pillar electrodes 96a and solders 96b) are formed to correspond to the hollow portions 92c, and terminals 97 are formed on the side on which the semiconductor chip 100 is stacked. The other remaining configurations of the semiconductor chips 50 and 90 are assumed to be the same as the semiconductor chip 40 for convenience herein. In the semiconductor chip 100, terminals 107 (pillar electrodes 107a and solders 107b) are formed.

When the electronic apparatus 1a is formed, the terminals 43 (the solders 43b) of the semiconductor chip 40 are bonded to the terminals 63 of the electronic component 60, and the terminals 55 (the solders 55b) of the semiconductor chip 50 are subsequently bonded to the terminals 45 of the semiconductor chip 40. Thereafter, the terminals 96 (the solders 96b) of the semiconductor chip 90 are bonded to the terminals 56 of the semiconductor chip 50, and the terminals 107 (the solders 107b) of the semiconductor chip 100 are subsequently bonded to the terminals 97 of the semiconductor chip 90.

In the electronic apparatus 1a, the planar sizes (or the volumes) of the hollow portions 42c of the semiconductor chip 40, the hollow portions 52c of the semiconductor chip 50, and the hollow portions 92c of the semiconductor chip 90 are larger on the lower layer (the side of the electronic component 60). Thus, it is possible to achieve uniformity and averaging of the heat H given at every time of the stacking of the semiconductor chip 40, the semiconductor chip 50, the semiconductor chip 90, and the semiconductor chip 100 on the electronic component 60 in this order, that is, the uniformity and the averaging of the heat H transferred to the terminal bonded portions.

That is, in a case in which the hollow portions 42c, 52c, and 92c are not formed, the heat H given at the time of the stacking is repeatedly transferred to the terminal bonded portions of the semiconductor chips in the lower layer. In this example, until the uppermost semiconductor chip 100 is stacked, the heat H at the time of the stacking (bonding) is transferred three times to the terminals 43 of the first stacked semiconductor chip 40, twice to the terminals 55 of the subsequently stacked semiconductor chip 50, and once to the terminals 96 of the subsequently stacked semiconductor chip 90. In this way, the heat at the time of the stacking is repeatedly transferred more to the terminal bonded portions of the semiconductor chip in the lower layer. Therefore, in a case in which the hollow portions are not formed in a portion corresponding to the terminal position, the alloying progresses more easily on the terminal bonded portions of the semiconductor chip in the lower layer and there is a high possibility of the bonding defects being caused due to deterioration in the bonding strength.

In contrast, in a case in which the hollow portions 42c, 52c, and 92c are formed, it is possible to suppress the heat H given at every time of the stacking of the semiconductor chips 40, 50, 90, and 100 in this order from being transferred to the terminal bonded portions in the lower layer. Further, by increasing the planar sizes of the hollow portions 42c, 52c and 92c in the lower layer, in other words, by increasing the volumes of the hollow portions of the semiconductor chips to which the number of repeated transfers of the heat H is greater, it is possible to achieve the uniformity or the averaging of the heat H transferred to the terminal bonded portions. Thus, it is possible to avoid a situation in which the alloying progresses more easily in the terminal bonded portions of the semiconductor chips in the lower layer, and thus it is possible to effectively suppress the bonding defects.

The electronic apparatus 1b illustrated in FIG. 21 is an example in which the depths (or the volumes) of the hollow portions 42c of the semiconductor chip 40, the hollow portions 52c of the semiconductor chip 50, and the hollow portions 92c of the semiconductor chip 90 are deeper in the lower layer (the side of the electronic component 60).

Even in such an electronic apparatus 1b, as in the electronic apparatus 1a, it is possible to suppress the transfer of the heat H given at every time of the stacking of the semiconductor chips 40, 50, 90, and 100 in this order from being transferred to the terminal bonded portions in the lower layer. Further, by increasing the depths of the hollow portions 42c, 52c and 92c in the lower layer, in other words, by increasing the volumes of the hollow portions of the semiconductor chips to which the number of repeated transfers of the heat H is greater, it is possible to achieve the uniformity or the averaging of the heat H transferred to the terminal bonded portions. Thus, it is possible to avoid a situation in which the alloying progresses more easily in the terminal bonded portions of the semiconductor chips in the lower layer, and thus it is possible to effectively suppress the bonding defects.

Here, the electronic apparatus is (see FIG. 20) in which the volumes of the hollow portions 42c, 52c, and 92c may be adjusted in accordance with the planar sizes at the definite depth and the electronic apparatus 1b (see FIG. 21) in which the volumes may be adjusted in accordance with the depths at the definite planar size have been exemplified. Additionally, the volumes of the hollow portions 42c, 52c, and 92c may also be adjusted in accordance with both of the planar sizes and the depths.

Here, the three-dimensional stacking structure of five layers including the electronic component 60 has been exemplified, but the number of layers is not limited thereto.

Figure 22:
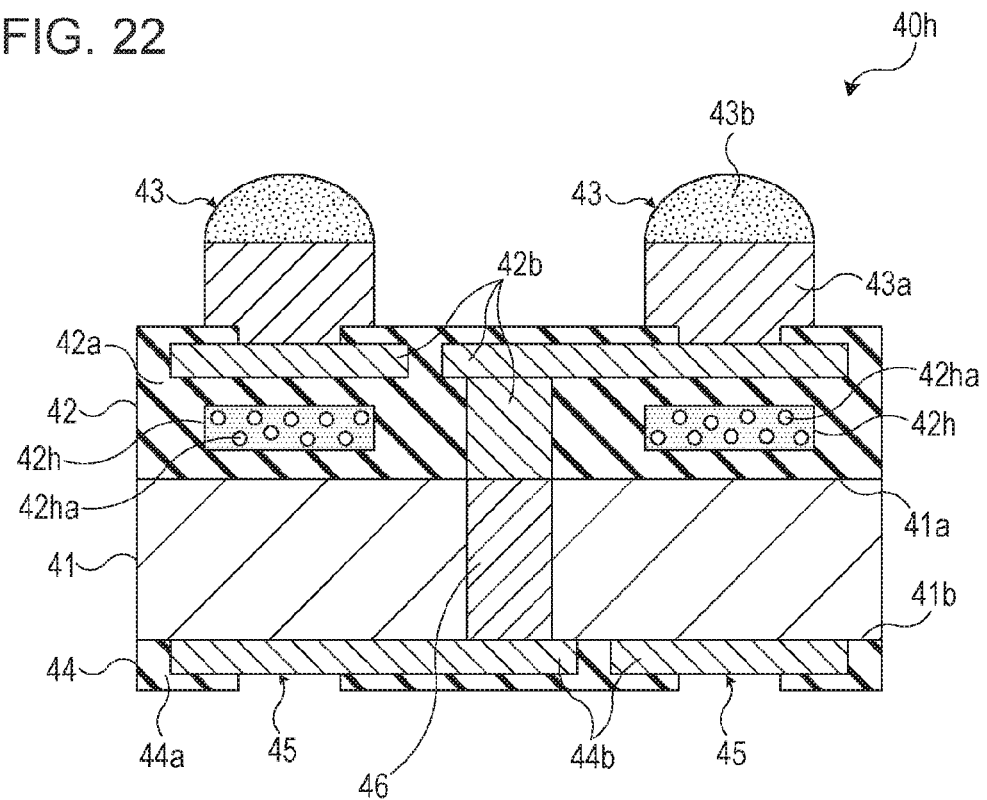
FIG. 22 is a diagram illustrating an example of a semiconductor chip according to a sixth embodiment.

Next, a sixth embodiment will be described. FIG. 22 is a diagram illustrating an example of a semiconductor chip according to the sixth embodiment. FIG. 22 schematically illustrates cross-sectional surfaces of main portions in an example of the semiconductor chip according to the sixth embodiment. A semiconductor chip 40h illustrated in FIG. 22 is different from the semiconductor chip 40 according to the second embodiment in that bubble containing portions 42h that are formed inside insulation portions 42a of a wiring layer 42 and contain bubbles 42ha are formed as portions in which thermal conductivity is relatively low.

In the bubble containing portions 42h, for example, resin layers containing the bubbles 42ha may be used. In the bubble containing portions 42h, the thermal conductivity is lower than in portions surrounding the bubble containing portions 42h. That is, the bubble containing portions 42h have lower thermal conductivity than the conductivity of the insulation portions 42a, or than the conductivity of the wiring layer 42 (42a and 42b), or than the conductivity of any of the wiring layer 42 (42a and 42b) and the semiconductor substrate 41, or than the conductivity of any of the wiring layer 42 (42a and 42b), the semiconductor substrate 41, and the wiring layer 44. The terminals 43 are formed at positions corresponding to the bubble containing portions 42h. In the semiconductor chip 40h, the transfer of the heat given from the side of the electronic component to the terminals 43 at the time of stacking of another electronic component on the side of the terminals 45 are suppressed by the bubble containing portions 42h.

Such bubble containing portion 42h may be formed in place of the hollow portions 42c. In a case in which the bubble containing portions 42h are formed, the bubble containing portions 42h are formed in place of the sacrifice layer 47 in the process of FIG. 8B described in the second embodiment. For example, phenol-based foamed resin layers are formed as the bubble containing portions 42h. Thereafter, the insulation layer 42ab is formed according to the process of FIG. 8C and the processes after the process of FIG. 10B are executed without forming the openings 42ac. Thus, it is possible to obtain the semiconductor chip 40h including the bubble containing portions 42h.

The bubble containing portions 42h have been exemplified herein. However, portions has lower thermal conductivity than the surrounding portions and the heat transfer to the side of the terminals 43 is suppressed further due to the existence of the portions than in a case in which the portions do not exist, the bubbles 42ha may not inevitably be contained. The portions may be resin layers that have relatively low thermal conductivity may be used. The portions are not limited to the resin layers, but ceramics having relatively low thermal conductivity or ceramics containing fine holes may also be used.

Even in a case in which a portion containing a gap (hollow portion) such as the bubbles 42ha or fine holes or a portion including a solid portion using a relatively low thermal conductivity material is formed as the portion that has relatively lower thermal conductivity than the surrounding portion, the volume of the portion may be adjusted with the planar size or depth, as in the third to fifth embodiments.

Figure 23:
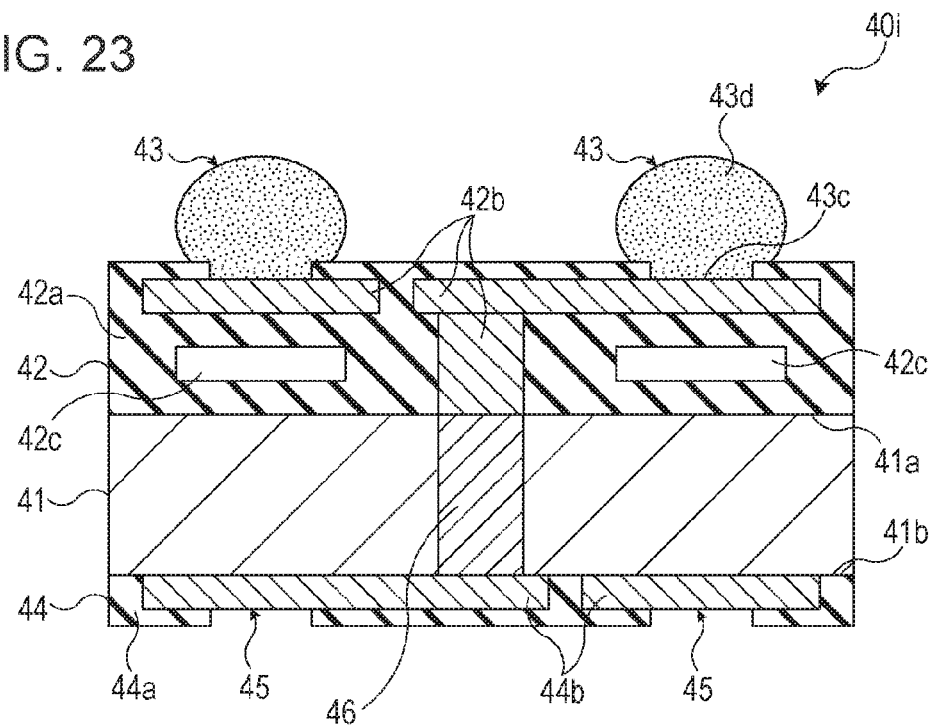
FIG. 23 is a diagram illustrating an example of a semiconductor chip according to a seventh embodiment.

Next, a seventh embodiment will be described. FIG. 23 is a diagram illustrating an example of a semiconductor chip according to the seventh embodiment. FIG. 23 schematically illustrates cross-sectional surfaces of main portions in an example of the semiconductor chip according to the seventh embodiment.

A semiconductor chip 40i illustrated in FIG. 23 is different from the semiconductor chip 40 according to the second embodiment in that solders 43d are formed as the terminals 43 on parts (pads) 43c of the conductor portions 42b of the wiring layer 42. For example, the solders 43d have the round shapes by heating and melting.

The semiconductor chip 40i may be obtained by forming Sn—Ag solders or the like serving as the solders 43d inside openings 48a of the resist 48 through electroplating using the seed layer 43aa as a power feed layer in the process of FIG. 11B described in the second embodiment, and heating and melting the solders. Alternatively, after the process of FIG. 10C, the semiconductor chip 40i may be obtained by mounting, on parts, solder balls serving as the solders 43d or applying, to the parts, a solder paste, the parts being portions of the conductor portions 42b which are the pads 43c and are exposed from openings 42af of the passivation film 42ae, and heating the melting the solder balls. In this way, the configuration in which the pillar electrodes 43a are not formed may be adopted in the terminals 43.

Figure 24A:
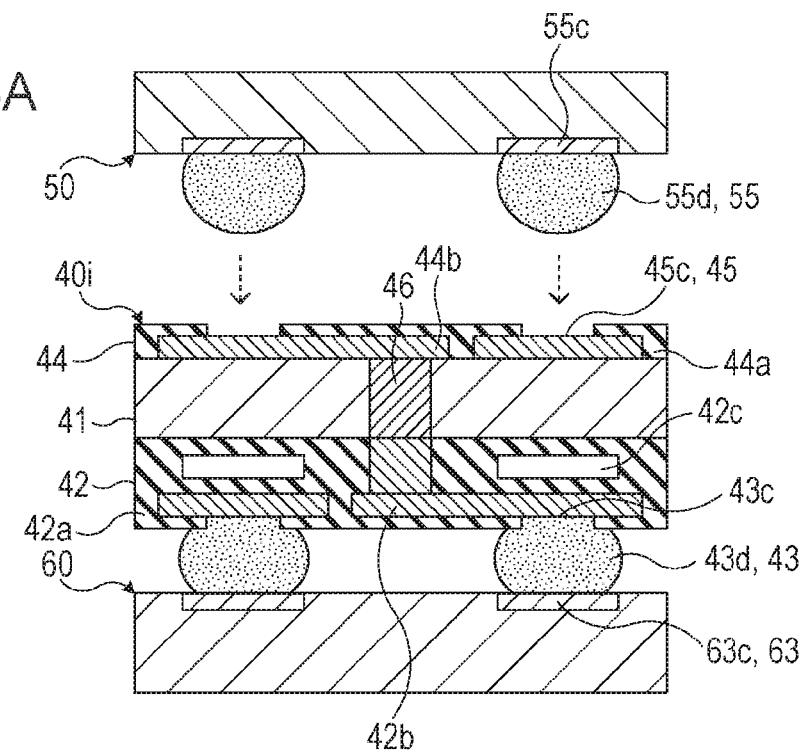
FIGS. 24A and 24B are diagrams illustrating an example of semiconductor chip stacking process according to the seventh embodiment.
Figure 24B:
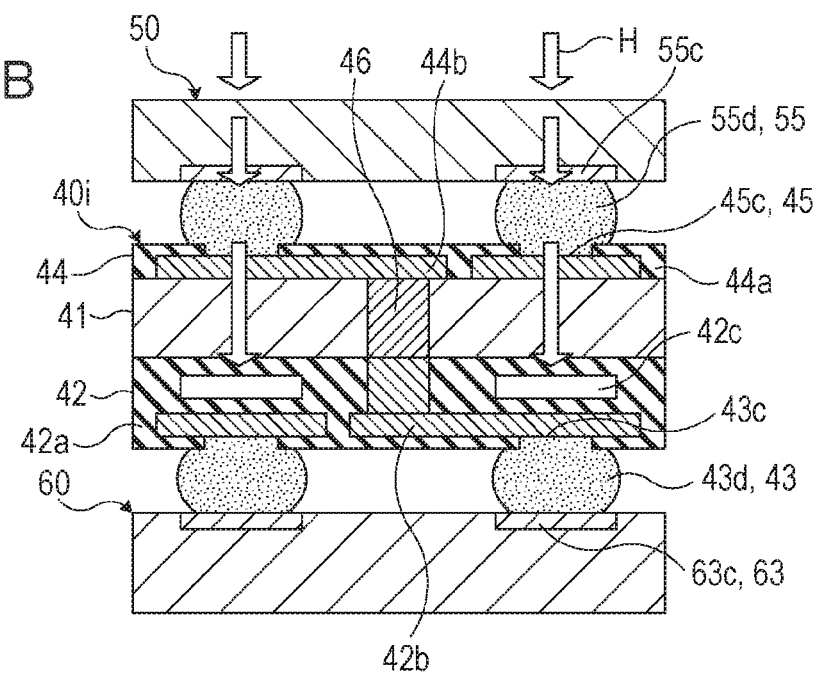

FIGS. 24A and 24B are diagrams illustrating an example of a semiconductor chip stacking process according to the seventh embodiment. FIGS. 24A and 24B schematically illustrate cross-sectional surfaces of main portions in the example of the semiconductor chip stacking process according to the seventh embodiment.

As illustrated in FIG. 24A, the semiconductor chip 40i is stacked on the electronic component 60 in such a manner that the solders 43d which are the terminals 43 are faced to the terminals 63 of the electronic component 60, in this example, the solders 43d are melted and bonded to the pads 63c. As illustrated in FIG. 24A, the semiconductor chip 50 is further disposed on the semiconductor chip 40i stacked on the electronic component 60 so that the terminals 55, in this example, solders 55d on the pads 55c are faced to the terminals 45 of the semiconductor chip 40, in this example, the pads 45c. As illustrated in FIG. 24B, the solders 55d are melted and bonded to the pads 45c, and thus the semiconductor chip 50 is stacked on the semiconductor chip 40i. Resin layers such as underfill resins may be formed between the electronic component 60 and the semiconductor chip 40i and between the semiconductor chips 40i and 50.

By forming the hollow portions 42c in the semiconductor chip 40i, it is possible to suppress transfer of the heat H given from the side of the semiconductor chip 50 at the time of the stacking of the semiconductor chip 50 to the solders 43d used to bond the semiconductor chip 40i and the electronic component 60. Thus, the alloying of the solders 43d caused due to component diffusion between the pads 43c or the pads 63c and the solders 43d is suppressed, and thus a bonding defect in the bonded portions of the semiconductor chip 40i and the electronic component 60 is suppressed.

Even in the case in which the solders 43d are used as the terminals 43 in this way, it is possible to suppress the bonding defect by the advantage of suppressing the heat transfer by the hollow portions 42c.

The terminal structure described in the seventh embodiment may be adopted in the electronic components 10, 20, and 30 described in the first embodiment, and the electronic component 60 and the semiconductor chips 40a, 40b, 40c, 40d, 40e, 40f, 40h, 50, 90, and 100 described in the third to sixth embodiments.

Figure 25:
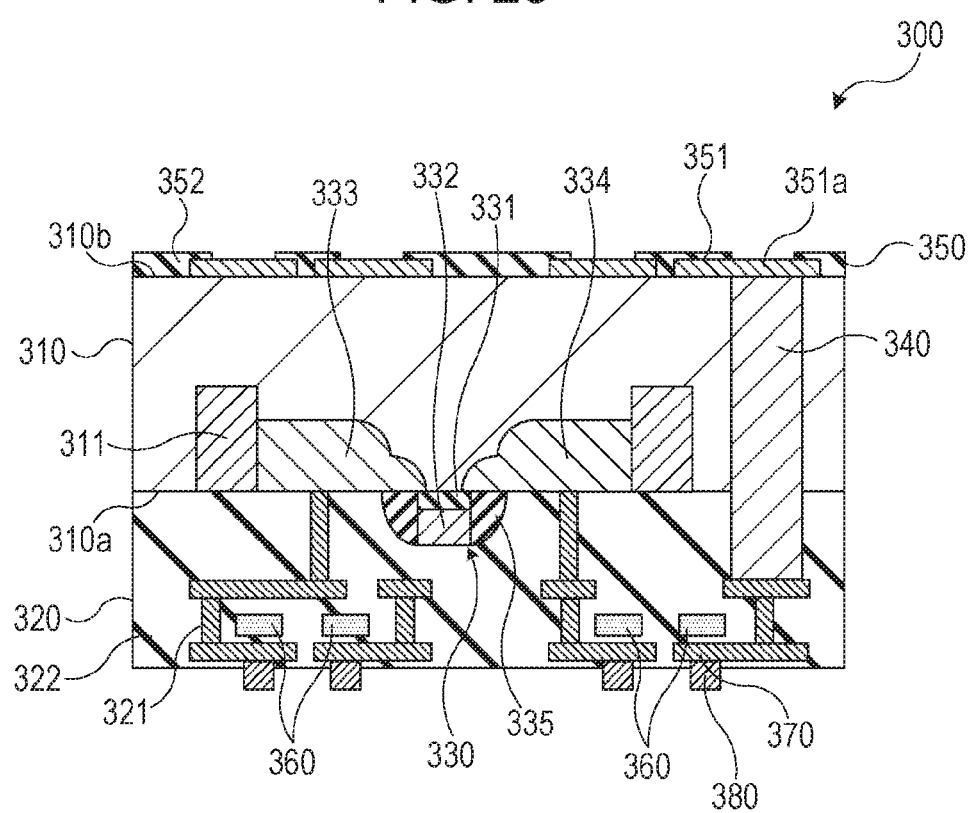
FIG. 25 is a diagram illustrating an example of the configuration of a semiconductor chip.

A semiconductor chip that has, for example, the following configuration to be described in FIG. 25 may be used as the semiconductor chips described above in the first to seventh embodiments. FIG. 25 is a diagram illustrating an example of the configuration of a semiconductor chip. FIG. 25 schematically illustrates cross-sectional surfaces of main portions in an example of the semiconductor chip.

A semiconductor chip 300 illustrated in FIG. 25 includes a semiconductor substrate 310 in which electronic components such as transistors are formed and a wiring layer 320 which is formed on a front surface 310a of the semiconductor substrate 310. As the semiconductor substrate 310, not only a substrate of Si, germanium (Ge), a silicon-germanium (SiGe), or the like but also a substrate of gallium arsenide (GaAs), indium phosphorus (InP), or the like is used. In such a semiconductor substrate 310, an electronic component such as a transistor, a capacitor, and a resistor is formed. FIG. 25 illustrates, for example, a metal oxide semiconductor (MOS) transistor 330.

The MOS transistor 330 is formed in an element region defined by an element isolation region 311 formed in the semiconductor substrate 310. The MOS transistor 330 includes a gate electrode 332 that is formed on the semiconductor substrate 310 with a gate insulation film 331 interposed therebetween and includes a source region 333 and a drain region 334 that are formed inside the semiconductor substrate 310 on both sides of the gate electrode 332. A spacer 335 (side wall) of an insulation film is formed on the side wall of the gate electrode 332.

The wiring layer 320 is formed on the semiconductor substrate 310 in which the MOS transistor 330 or the like is formed. The wiring layer 320 includes a conductor portion 321 (a wiring, a via, or the like) electrically coupled to the MOS transistor 330 or the like formed in the semiconductor substrate 310 and an insulation portion 322 that covers the conductor portion 321. In the conductor portion 321, any of various conductive materials such as Cu is used. In the insulation portion 322, an inorganic insulation material such as SiO or an organic insulation material such as resin is used.

A TSV 340 that penetrates through the semiconductor substrate 310 and is electrically coupled to the conductor portion 321 of the wiring layer 320 is formed in the semiconductor chip 300. A wiring layer 350 (rewiring layer) that includes a conductor portion 351 (a wiring, a pad, or the like) electrically coupled to the TSV 340 and an insulation portion 352 covering the conductor portion 351 is formed on the rear surface 310b of the semiconductor substrate 310. A part of the conductor portion 351 exposed from the insulation portion 352 is used as a pad 351a.

Portions 360 having relatively low thermal conductivity as in the portions 14, the hollow portions 42c, and the bubble containing portions 42h described in the first to seventh embodiments are formed inside the insulation portion 322 of the wiring layer 320 of the semiconductor chip 300. The portions 360 have lower thermal conductivity than the thermal conductivity of the insulation portion 322, or than the thermal conductivity of the wiring layer 320 (322 and 321), or than the thermal conductivity of any of the wiring layer 320 (322 and 321) and the semiconductor substrate 310, or than the thermal conductivity of any of the wiring layer 320 (322 and 321), the semiconductor substrate 310, and the wiring layer 350. A terminal 380 is formed at a position corresponding to the portion 340 with the pad 370 interposed therebetween.

The semiconductor chip 300 is stacked (bonded) to another electronic component using the terminal 380. Still another electronic component is stacked (bonded) using the pad 351a on the side of the rear surface 310b of the semiconductor substrate 310 of the semiconductor chip 300. Heat is given from the side of the rear surface 310b of the semiconductor substrate 310 to the semiconductor chip 300 when the semiconductor chip 300 is stacked (bonded) to the other electronic component or the other electronic component is stacked (bonded).

A pad 370 is exposed from the writing layer 320 to serve as a terminal. The portions 14, the hollow portions 42c, the bubble containing portions 42h having the relatively low thermal conductivity, as described above in the first to seventh embodiments, may also be applied to a semiconductor package or a circuit substrate in addition to a semiconductor chip.

Figure 26A:
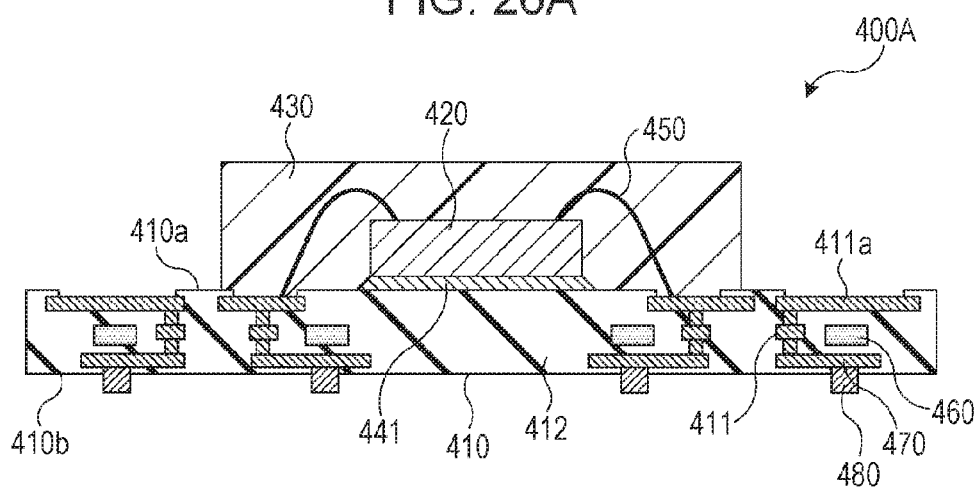
FIGS. 26A and 26B are diagrams illustrating an example of the configuration of a semiconductor package.
Figure 26B:
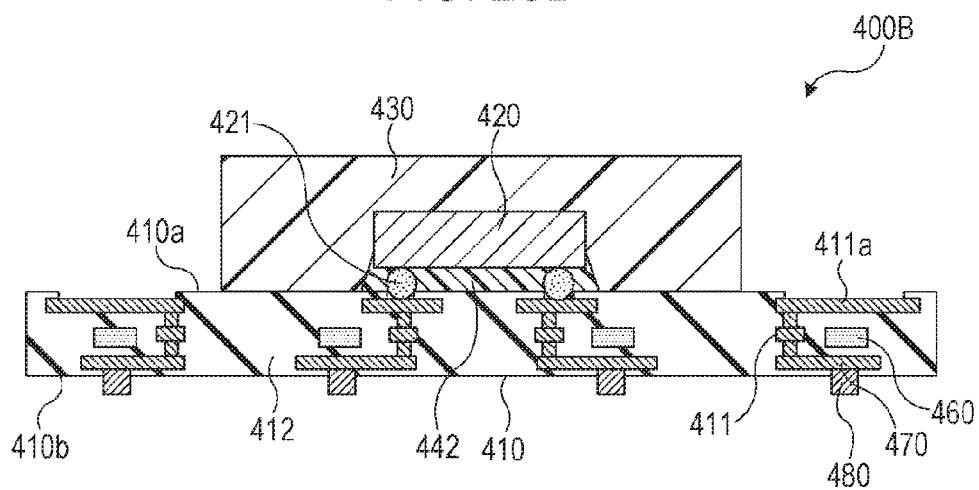

FIGS. 26A and 26B are diagrams illustrating an example of the configuration of a semiconductor package. FIGS. 26A and 26B schematically illustrate cross-sectional surfaces of main portions in the example of the semiconductor package. A semiconductor package 400A illustrated in FIG. 26A and a semiconductor package 400B illustrated in FIG. 26B each include a package substrate 410, a semiconductor chip 420 that is mounted on the package substrate 410, and a sealing layer 430 that seals the semiconductor chip 420.

For example, a printed substrate is used as the package substrate 410. The package substrate 410 includes a conductor portion 411 (a wiring, a via, or the like) and an insulation portion 412 that covers the conductor portion 411. In the conductor portion 411, any of various conductive materials such as Cu is used. In the insulation portion 412, for example, a resin material such as a phenol resin, an epoxy resin, or a polyimide resin or a composite resin material in which such a resin material is impregnated in glass fibers or carbon fibers is used.

In the semiconductor package 400A of FIG. 26A, the semiconductor chip 420 is adhered and fixed to the front surface 410a of the package substrate 410 by a die attachment material 441 such as a resin or a conductivity paste and is wire-bonded by wires 450. The semiconductor chip 420 and the wires 450 are sealed by the sealing layer 430. In the semiconductor package 400B of FIG. 26B, the semiconductor chip 420 is flip-chip-bonded to the front surface 410a of the package substrate 410 by solder bumps 421. A space between the package substrate 410 and the semiconductor chip 420 is filled with an underfill resin 442. The semiconductor chip 420 is sealed by the sealing layer 430. In the sealing layer 430, a resin material such as an epoxy resin or a material in which insulation fillers are impregnated in such a resin material is used.

Inside the insulation portion 412 of the package substrate 410 in each of the semiconductor packages 400A and 400B, portions 460 having relatively low thermal conductivity as in the portions 14, the hollow portions 42c, and the bubble containing portions 42h described above in the first to seventh embodiments are formed. The portions 460 have lower thermal conductivity than the insulation portion 412 or the insulation portion 412 and the conductor portion 411 of the package substrate 410. Terminals 480 are formed at positions corresponding to the portions 460 on the side of the rear surface 410b of the package substrate 410 with pads 470 interposed therebetween.

The semiconductor packages 400A and 400B are each stacked (bonded) on another electronic component using the terminals 480. Another electronic component is stacked (bonded) on each of the semiconductor packages 400A and 400B using parts of the conductor portions 411 exposed from the sealing layer 430 and the insulation portion 412 on the side of the front surface 410a of the package substrate 410 as pads 411a. For example, another electronic component is stacked by bonding solder bumps with relatively large sizes greater than the height of the sealing layer 430 to the pads 411a or bonding solder bumps to posts with a predetermined height formed on the pads 411a. Heat is given from the side of the front surface 410a of each of the package substrate 410 to the semiconductor packages 400A and 400B when the semiconductor package is stacked (bonded) to the other electronic component or the other electronic component is stacked (bonded). The pads 470 are exposed to the side of the rear surface 410b of the package substrate 410 to serve as terminals.

A plurality of different kinds or same kind of semiconductor chips 420 may be mounted on the package substrate 410 of each of the semiconductor packages 400A and 400B, or another electronic component such as a chip capacitor may be mounted in addition to the semiconductor chip 420.

Figure 27:
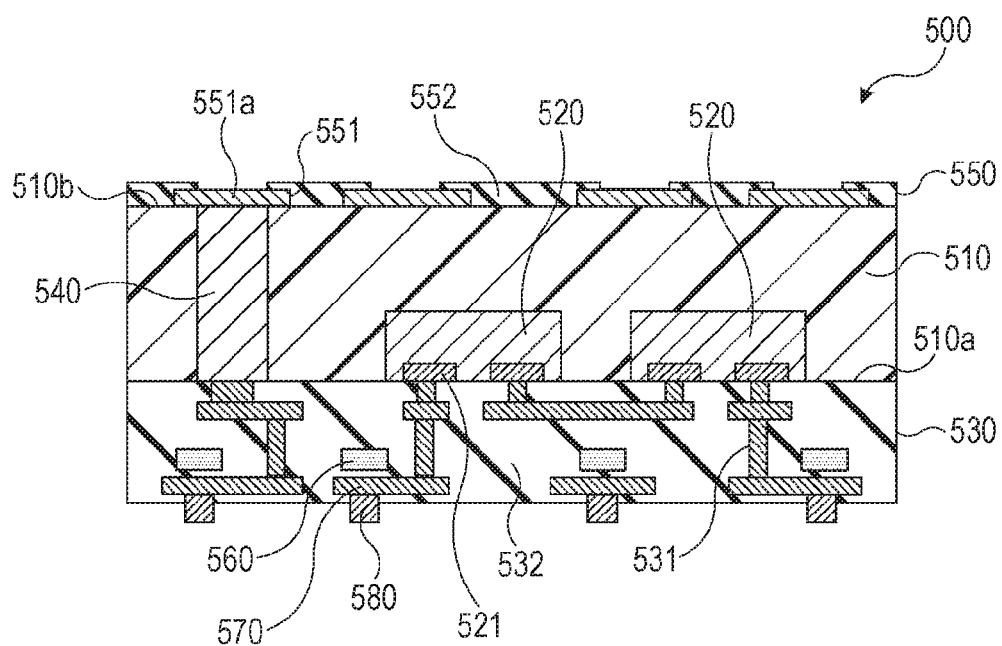
FIG. 27 is a diagram illustrating another example of the configuration of the semiconductor package.

FIG. 27 is a diagram illustrating another example of the configuration of the semiconductor package. FIG. 27 schematically illustrates cross-sectional surfaces of main portions in the other example of the semiconductor package. A semiconductor package 500 illustrated in FIG. 27 includes a resin layer 510, a plurality of different kinds or same kind of semiconductor chips 520 (herein, for example, two chips) embedded in the resin layer 510, and a wiring layer 530 (rewiring layer) that is formed on a front surface 510a of the resin layer 510. The semiconductor package 500 is also called a pseudo system on a chip (SoC).

The semiconductor chips 520 are embedded in the resin layer 510 so that surfaces for arranging terminals 521 are exposed. The wiring layer 530 includes conductor portions 531 (rewiring, vias, pads, or the like) of Cu or the like and an insulation portion 532 such as a resin material that covers the conductor portions 531.

In the semiconductor package 500, a through electrode 540 that penetrates through the resin layer 510 and is electrically coupled to the conductor portion 531 of the wiring layer 530 is formed. A wiring layer 550 (rewiring layer) that includes conductor portions 551 (wirings, pads, or the like) electrically coupled to the through electrode 540 and an insulation portion 552 covering the conductor portions 551 is formed on a rear surface 510b of the resin layer 510. A part of the conductor portion 551 exposed from the insulation portion 552 is used as a pad 551a.

Inside the insulation portion 532 of the wiring layer 530 of the semiconductor package 500, portions 560 having relatively low thermal conductivity as in the portions 14, the hollow portions 42c, and the bubble containing portions 42h described above in the first to seventh embodiments are formed. The portions 560 have lower thermal conductivity than the thermal conductivity of the insulation portion 532, or than the thermal conductivity of the wiring layer 530 (532 and 531), or than the thermal conductivity of any of the wiring layer 530 (532 and 531), the resin layer 510, and the inside of the resin layer 510, or than the thermal conductivity of any of the wiring layer 530 (532 and 531), the resin layer 510, the inside of the resin layer 510, and the wiring layer 550. Terminals 580 are formed at positions corresponding to the portions 560 with the pads 570 interposed therebetween.

The semiconductor package 500 is stacked (bonded) to another electronic component using the terminals 580. Another electronic component is stacked (bonded) on the side of the rear surface 510b of the resin layer 510 of the semiconductor package 500 using the pads 551a. Heat is given from the side of the rear surface 510b of the resin layer 510 to the semiconductor package 500 when the semiconductor package is stacked (bonded) to the other electronic component or the other electronic component is stacked (bonded).

The pads 570 are exposed from the wiring layer 530 to serve as terminals. One semiconductor chip 520 or different kinds or the same kind of three or more semiconductor chips 520 may be embedded in the resin layer 510 of the semiconductor package 500, or another electronic component such as a chip capacitor may be embedded in addition to the semiconductor chip 520.

Figure 28:
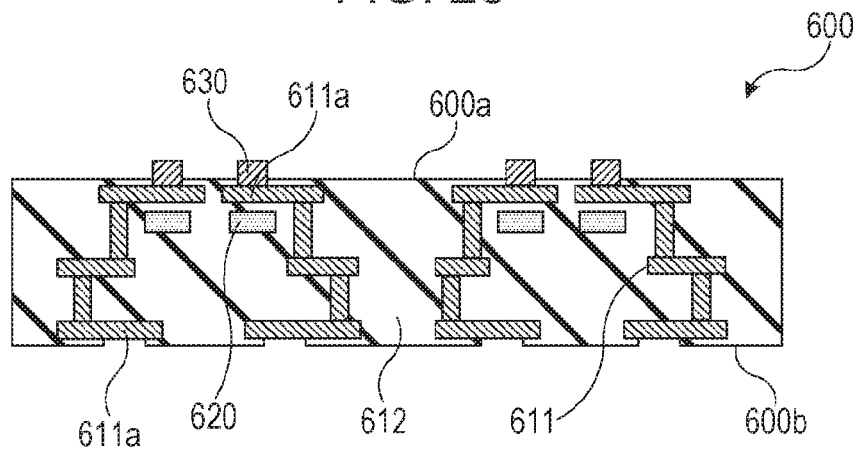
FIG. 28 is a diagram illustrating an example of the configuration of a circuit substrate.

FIG. 28 is a diagram illustrating an example of the configuration of a circuit substrate. FIG. 28 schematically illustrates cross-sectional surfaces of main portions in the example of the circuit substrate. In FIG. 28, a multi-layer printed substrate including a plurality of wiring layers is exemplified as a circuit substrate 600. The circuit substrate 600 includes conductor portions 611 (wirings, vias, or pads) of Cu or the like and an insulation portion 612 such as a resin material that covers the conductor portions 611. Part of the conductor portions 611 exposed from the insulation portion 612 are used as pads 611a.

Inside the insulation portion 612 of the circuit substrate 600, portions 620 having relatively low thermal conductivity as in the portions 14, the hollow portions 42c, and the bubble containing portions 42h described above in the first to seventh embodiments are formed. The portions 620 have lower thermal conductivity than the thermal conductivity of the insulation portion 612 or than the thermal conductivity of any of the insulation portion 612 and the conductor portion 611. Terminals 630 are formed at positions corresponding to the portions 620 with the pads 611a interposed therebetween.

The circuit substrate 600 is stacked (bonded) to another electronic component using the terminals 630. Another electronic component is stacked (bonded) on the side of the rear surface 600b of the circuit substrate 600 using the pads 611a. Heat is given from the side of the rear surface 600b to the circuit substrate 600 when the circuit substrate is stacked (bonded) to the other electronic component or the other electronic component is stacked (bonded).

The pads 611a are exposed to the side of the front surface 600a of the circuit substrate 600 to serve as terminals. As in the circuit substrate 600, the foregoing portions 620 may also be adopted in a build-up substrate in which wiring patterns and insulation layers are stacked on the front and rear surfaces of a core substrate and an interposer in which a Si substrate, an organic substrate, or a glass substrate is used as a core substrate in addition to the multi-layer printed substrate.

Technologies of forming portions having relatively low thermal conductivity, as described in the first to seventh embodiments, may be adopted in various electronic components such as the semiconductor chip 300 illustrated in FIG. 25, the semiconductor packages 400A, 400B, and 500 illustrated in FIGS. 26A, 26B, and 27, and the circuit substrate 600 illustrated in FIG. 28.

As combinations of electronic components to be stacked, there are a combination of a semiconductor chip and a circuit substrate, a combination of a semiconductor package and a circuit substrate, a combination of a semiconductor chip and a semiconductor package, a combination of semiconductor chips, a combination of semiconductor packages, and a combination of circuit substrates.

A combination of electronic components to be stacked may be a combination of electronic components after separation, a combination of an electronic component before separation and an electronic component after separation, or a combination of electronic components before separation.

A stack body including electronic components in which the foregoing technologies of forming portions having relatively low thermal conductivity are adopted may be adopted in various electronic apparatuses such as a personal computer, a super computer, a server, a smartphone, a mobile phone, a tablet terminal, a camera, an audio apparatus, a measurement apparatus, an inspection apparatus, and a manufacturing apparatus. By adopting the foregoing technologies, it is possible to realize various electronic apparatuses and various electronic devices which have a high capability and high quality and include an electronic component group in which bonding defects are suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic component comprising:
a substrate configured to include a first portion that first thermal conductivity, and have a first surface and a second surface opposite to the first surface;
a first wiring layer provided on the first surface;
a second wiring layer provided on the second surface;
a second portion configured to be formed inside the first wiring layer, and have second thermal conductivity lower than the first thermal conductivity;
a first terminal configured to be formed to correspond to the second portion on a side of the first surface;
a second terminal configured to be formed on a side of the second surface; and
a vias provided side by side with the second portion in a horizontal direction and configured to penetrate the substrate between the first surface and the second surface and couple a first conductor portion in the first wiring layer and a second conductor portion in the second wiring layer.

2. The electronic component according to claim 1, wherein the second portion includes a hollow portion.

3. The electronic component according to claim 1, wherein the first wiring layer includes a first insulation layer in which the second portion is provided.

4. The electronic component according to claim 1, wherein the first terminal includes a solder.

5. An electronic apparatus comprising:
a first electronic component configured to include:
  a first substrate configured to include a first portion having first thermal conductivity, and have a first surface and a second surface opposite to the first surface
  a first wiring layer provided on the first surface;
  a second wiring layer provided on the second surface;
  a second portion configured to be formed inside the first wiring layer, and have second thermal conductivity lower than the first thermal conductivity;
  a first terminal configured to be formed to correspond to the second portion on a side of the first surface;
  a second terminal configured to be formed on a side of the second surface of the first substrate opposite to the first surface; and
  a vias provided side by side with the second portion in a horizontal direction and configured to penetrate the substrate between the first surface and the second surface and couple a first conductor portion in the first wiring layer and a second conductor portion in the second wiring layer; and
a second electronic component configured to include a third terminal coupled to the second terminal.

6. The electronic apparatus according to claim 5, wherein the second electronic component further includes a second substrate configured to include a third portion having third thermal conductivity, and have a third surface and a fourth surface opposite to the third surface, a fourth portion formed inside the third portion and configured to have fourth thermal conductivity lower than the third thermal conductivity, the third terminal formed to correspond to the fourth portion on a side of the third surface, and a fourth terminal formed on a side of the fourth surface of the second substrate, and wherein the electronic apparatus further comprises: a third electronic component configured to include a fifth terminal coupled to the fourth terminal.

7. The electronic apparatus according to claim 6, wherein the fourth portion has a different volume from the second portion.

8. The electronic apparatus according to claim 5, further comprising: a fourth electronic component configured to include a sixth terminal coupled to the first terminal.

9. A method of manufacturing an electronic apparatus, the method comprising:
  facing a second terminal of a first electronic component to a third terminal of a second electronic component, the first electronic component configured to include:
    a first substrate which includes a first portion which has first thermal conductivity;
    a first wiring layer provided on the first surface of the first substrate;
    a second wiring layer provided on the second surface of the first substrate;
    a second portion which is formed inside the first wiring layer and has second thermal conductivity lower than the first thermal conductivity;
    a first terminal which is formed to correspond to the second portion on a side of a first surface of the first substrate;
    a second terminal which is formed on a side of a second surface of the first substrate opposite to the first surface; and
    a vias provided side by side with the second portion in a horizontal direction and configured to penetrate the substrate between the first surface and the second surface and couple a first conductor portion in the first wiring layer and a second conductor portion in the second wiring layer; and
  coupling the third terminal and the second terminal by executing heating from a side of the second electronic component.

10. The method of manufacturing the electronic apparatus according to claim 9, wherein the second electronic component further includes a second substrate configured to include a third portion which has third thermal conductivity, a fourth portion configured to be formed inside the third portion and have fourth thermal conductivity lower than the third thermal conductivity, the third terminal configured to be formed to correspond to the fourth portion on a side of a third surface of the second substrate, and a fourth terminal configured to be formed on a side of a fourth surface of the second substrate opposite to the third surface, and wherein the method further comprises:
  after the coupling of the third terminal and the second terminal, facing the fourth terminal of the second electronic component to a fifth terminal of a third electronic component; and
  coupling the fourth terminal and the fifth terminal by executing heating from a side of the third electronic component.

11. The method of manufacturing the electronic apparatus according to claim 10, wherein the fourth portion has a smaller volume than the second portion.

12. The method of manufacturing the electronic apparatus according to claim 9, wherein before the coupling of the second terminal and the third terminal, a sixth terminal of a fourth electronic component is bonded to the first terminal of the first electronic component.

13. The method of manufacturing the electronic apparatus according to claim 9, further comprising:
  coupling the first terminal to a sixth terminal of a fourth electronic component after the coupling of the second terminal and the third terminal.

14. The electronic component according to claim 1, wherein a cross-sectional area of the second portion is larger than a cross-sectional area of the first terminal.

15. The electronic component according to claim 1, wherein the second portion includes bubbles.

16. The electronic apparatus according to claim 5, wherein a cross-sectional area of the second portion is larger than a cross-sectional area of the first terminal.

17. The electronic apparatus according to claim 5, wherein the second portion includes bubbles.

18. The method according to claim 9, wherein a cross-sectional area of the second portion is larger than a cross-sectional area of the first terminal.

19. The method according to claim 9, wherein the second portion includes bubbles.

* * * * *